(12) United States Patent
Shimamoto et al.

(10) Patent No.: US 6,362,627 B1
(45) Date of Patent: Mar. 26, 2002

(54) VOLTAGE MEASURING INSTRUMENT WITH FLYING CAPACITOR

(75) Inventors: Takeshi Shimamoto, Hirakata; Nobuyoshi Nagagata, Takatsuki, both of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/403,512

(22) PCT Filed: Mar. 5, 1999

(86) PCT No.: PCT/JP99/01075
§ 371 Date: Dec. 29, 1999
§ 102(e) Date: Dec. 29, 1999

(87) PCT Pub. No.: WO99/45402
PCT Pub. Date: Sep. 10, 1999

(30) Foreign Application Priority Data

| Mar. 6, 1998 | (JP) | 10-054685 |
| Mar. 6, 1998 | (JP) | 10-054689 |
| Mar. 6, 1998 | (JP) | 10-054690 |

(51) Int. Cl.[7] .................... G01R 31/36; G01R 31/40
(52) U.S. Cl. ................. 324/434; 324/771; 324/73.1
(58) Field of Search ................ 324/771, 426, 324/434, 73.1

(56) References Cited

U.S. PATENT DOCUMENTS

| 4,590,430 A | * | 5/1986 | Vandenberghe et al. .... 324/434 |
| 5,646,534 A | * | 7/1997 | Kopera ....................... 324/434 |
| 5,712,568 A | * | 1/1998 | Flohr et al. ................. 324/434 |
| 5,914,606 A | * | 6/1999 | Becker-Irvin .............. 324/434 |

FOREIGN PATENT DOCUMENTS

| JP | 8-140204 | 5/1996 |
| JP | 9-1617 | 1/1997 |

* cited by examiner

Primary Examiner—Glenn W. Brown
(74) Attorney, Agent, or Firm—Sheridan Ross P.C.

(57) ABSTRACT

The voltage measuring apparatus of the present invention comprises: a capacitor configured of a plurality of capacitor elements and divided at a connection point into two sections of the same capacitance; a first switching device for connecting a voltage source to be measured to both terminals of the capacitor; a differential amplifier; a second switching device for connecting both terminals of the capacitor to inputs of the differential amplifier; and a third switch for connecting the connection point in the capacitor to signal reference potential of the differential amplifier in time synchronization with the second switching device.

11 Claims, 25 Drawing Sheets

US 6,362,627 B1

VOLTAGE MEASURING INSTRUMENT WITH FLYING CAPACITOR

RELATED APPLICATIONS

This application is a U.S. national phase application of PCT Application Ser. No. PCT/JP99/01075, filed Mar. 5, 1999, which claims priority from Japanese Patent Application Nos. Hei 10-054689, filed Mar. 6, 1998; Hei 10-054685, filed Mar. 6, 1998; and Hei 10-054690, filed Mar. 6, 1998.

FIELD OF THE INVENTION

The present invention relates to an isolation-type voltage measuring apparatus for measuring a voltage from an electrical apparatus under conditions electrically isolated from the electrical apparatus to be measured, and more particularly to a voltage measuring apparatus with flying capacitor method having a capacitor and a switch.

BACKGROUND ART

In recent years, in an electrical system for making voltage measurements, it has been known to use an isolation-type voltage measuring apparatus wherein the electrical apparatus to be measured, for example, a voltage source, is isolated electrically or separated in terms of electric potential from the voltage measuring part. More specifically, in a power supply system for an electric vehicle or a power storage system for a domestic use, a monitor apparatus for monitoring voltage is connected to battery cells with the above-mentioned voltage measuring apparatus, and the voltage from the battery cells is measured and monitored under conditions electrically isolated from the battery cells.

Stated more specifically a high output power source of hundreds of volts for the electric vehicle or the like is configured, as is well known, with connecting in series a large number of secondary battery cells exemplified by stacked- or aggregate-type nickel hydrogen storage cells. To control the charging and discharging of these series connected cells, the performance of each individual cell must be monitored. Further, in the electric vehicle, the high voltage system including the high output power source is electrically isolated from the chassis to prevent hazards. On the other hand, since the processor for controlling the charging and discharging uses the chassis as a reference potential, the cell voltage must be measured in an electrically isolated manner.

A first voltage measuring apparatus for making such voltage measurements, has a monitoring apparatus for a battery pack as disclosed in Japanese Unexamined Patent Publication No. 8-140204. This first conventional voltage measuring apparatus comprises a voltage monitoring unit which includes an operational amplifier, an A/D converter, a photocoupler, and a reference power supply, and is designed to measure the voltage of a 240-cell series battery (stacked-type voltage source) delivering a total voltage of 288 V. More specifically, in this first conventional voltage measuring apparatus, since it is actually difficult to measure and monitor many voltages of large number of individual cell, 10 cells are grouped into one module, and the voltage of each module, in an example, voltages of 24 modules, are measured using a voltage measuring apparatus.

However, in the above-mentioned first conventional voltage measuring apparatus, there was a problem that the configuration of the measuring apparatus is rather complicated because the voltage monitoring unit having a complex construction has to be provided for each module.

A second conventional voltage measuring apparatus, for example, U.S. Pat. No. 5,163,754 discloses a temperature measuring apparatus. This second conventional voltage measuring apparatus measures the output voltage of a thermocouple in an electrically isolated manner by using the earlier described flying capacitor method.

A major section of the second conventional voltage measuring apparatus will be described in detail below with reference to FIG. 23.

FIG. 23 is a circuit diagram showing a major section of a second conventional voltage measuring apparatus.

As shown in FIG. 23, in the second conventional voltage measuring apparatus, a voltage source 101 to be measured is connected to a capacitor 103 via a first switching device 102, and the capacitor 103 is connected to a buffer circuit 105 via a second switching device 104. The first switching device 102 is configured with two switches 102a and 102b which operate in interlocking fashion with each other. Likewise, the second switching device 104 is configured with two switches 104a and 104b which operate in interlocking fashion with each other. Each of the switches 102a, 102b, 104a, and 104b is constructed from an isolated driving type analog switching element having high voltage withstanding capability, for example, a MOSFET with optical driver. The buffer circuit 105 is connected to a known voltmeter (not shown).

In the above-mentioned second conventional voltage measuring apparatus, first, while holding the second switching device 104 in the OFF-state, the first switching device 102 turns on to transfer the voltage of the voltage source 101 to the capacitor 103. Thereby, the capacitor 103 holds the voltage. Next, the first switching device 102 turns off and the second switching device 104 turns on, thereby to input the voltage of the voltage source 101 into the buffer circuit 105. In this way, with the first and second switching devices 102 and 104 not in the ON-state simultaneously, the second conventional voltage measuring apparatus measures the voltage of the voltage source 101 by maintaining electrical isolation from the voltage source 101.

However, in the second conventional voltage measuring apparatus, there was a problem that accuracy of voltage acquisition by and at the capacitor 103 degrades, hence leading to a degradation in voltage measurement accuracy.

The problem of the voltage measurement accuracy degradation in the second conventional voltage measuring apparatus will be explained with reference to FIG. 23.

As shown in FIG. 23, in the case that the voltage source 101 is superimposed on a disturbance voltage (hereinafter also referred to as a "common mode voltage") En which is unsteady with respect to ground potential, the instant that the first switching device 102 held in the ON-state turns off and the second switching device 104 turns on, the voltage between both terminals of each of the switches 102a and 102b changes from zero toward the disturbance voltage En. As a result, in the second conventional voltage measuring apparatus, leakage currents Ia and Ib shown in the figure flow based on the change of the charge on capacitances of the respective switches 102a and 102b in the OFF-state. The leakage current Ia passes through the capacitor 103 and flows into ground potential for the buffer circuit 105 together with the leakage current Ib. As a result, in the second conventional voltage measuring apparatus, the common mode error occurs in which the voltage for measurement that should be held in the capacitor 103 is offset by the leakage current Ia caused by the disturbance voltage En, and thereby to degrade the accuracy of voltage measurement.

When the measuring method of flying capacitor method of the second conventional apparatus is employed, the voltage measuring apparatus of first conventional can be simplified in construction thereof. However, even when the measuring method of the second conventional apparatus is employed, expensive isolated driving type analog switch elements totaling 96 in number must be used for the 24 modules (stacked type voltage source), and further improvements have been needed in terms of the cost, size, and reliability.

Next, a third conventional voltage measuring apparatus will be described with reference to FIG. 24.

FIG. 24 is a circuit diagram showing a configuration of a third conventional voltage measuring apparatus.

As shown in FIG. 24, in this third conventional voltage measuring apparatus, the buffer circuit 105 shown in FIG. 23 is replaced by a differential amplifier 106, and a resistor 107 is provided for settling the potential of the capacitor 103 within the input operating range of the differential amplifier 106. The resistor 107 consists of series connected resistors 107a and 107b, and an intermediate terminal therebetween is grounded.

In the third conventional voltage measuring apparatus, the leakage currents Ia and Ib occur as in the second conventional apparatus shown in FIG. 23. However, in the third conventional voltage measuring apparatus, the resistors 107a and 107b are chosen to have the same value, so that the leakage currents Ia and Ib flow into ground potential through the respective resistors 107a and 107b without passing through the capacitor 103. Accordingly, in the third conventional voltage measuring apparatus, the common mode error does not occur.

However, the third conventional voltage measuring apparatus has conflicting design constraints such that, from the viewpoint of the settling time required in the differential amplifier 106 and determined by the resistance value of the resistor 107 and the capacitance of the first switching device 102 in the OFF-state, the resistance value of the resistor 107 should be made small in order to shorten the time required for the settling. On the other hand, of the viewpoint of the voltage leakage from the capacitor 103 in a period from the time when the second switching device 104 turns on to the voltage measurement is completed, the above-mentioned resistance value should be made large. The reason why is to reduce the voltage drop by the resistor 107. As a result, in the third conventional voltage measuring apparatus, the selection and determination of the resistance value has not been able to be made easily, either leading to an increase in the settling time or causing a voltage leakage error due to the voltage leakage, and it has thus been difficult to improve the performance of the measuring apparatus.

Next, a conventional voltage measuring apparatus for measuring the voltages of a plurality of voltage sources, each in an electrically isolated manner, will be described with reference to FIG. 25. This fourth conventional voltage measuring apparatus is described in Japanese Unexamined Patent Publication No. 9-1617.

FIG. 25 is a circuit diagram showing a configuration of a fourth conventional voltage measuring apparatus.

In this fourth conventional voltage measuring apparatus shown in FIG. 25, a flying capacitor circuit comprising a capacitor and first and second switches is connected to each one of a plurality of voltage sources 111, 112, 113, etc. as well as the one shown in FIG. 23. To the voltage source 111, for example, are connected the first switching device 121, the capacitor 131, and the second switching device 141 in this order. Further, in the fourth conventional voltage measuring apparatus, both ends of each of the second switches 141, 142, 143, etc. are connected to an A/D converter 150 which in turn is connected to a digital counting circuit not shown.

In the fourth conventional voltage measuring apparatus, first, while holding the second switching devices 141, 142, 143, etc. in the OFF-state, the first switching devices 121, 122, 123, etc. turn on, thus charging the capacitors 131, 132, 133, etc. with the voltages of the corresponding voltage source 111, 112, 113, etc. Next, while holding the first switching devices 121, 122, 123, etc. in the OFF-state, the second switching devices 141, 142, 143, etc. sequentially turn on, thereby transferring the terminal voltages of the capacitors 131, 132, 133, etc. to the A/D converter 150. In this way, in the fourth conventional voltage measuring apparatus, the voltage from each of the plurality of voltage sources is measured while maintaining the electrical isolation between each voltage source and the counting circuit by the phase relationship between the operations of the respective switches.

However, since the fourth conventional voltage measuring apparatus requires as many flying capacitor circuits as there are voltage sources, it has not been possible to simplify the configuration of the measuring apparatus. Furthermore, as in the second conventional apparatus, the common mode error occurs, causing a degradation of the voltage acquisition accuracy at each capacitor and hence, a degradation of voltage measurement accuracy.

As described in the above, in the conventional voltage measuring apparatuses, it has not been possible to simplify the configuration of the measuring apparatus; furthermore, it has been difficult to alleviate performance problems such as common mode error, settling time, or voltage leakage error.

DISCLOSURE OF THE INVENTION

An object of the present invention is to provide a voltage measuring apparatus that can easily improve the accuracy of voltage measurement by alleviating performance problems such as common mode error, settling time, and voltage leakage error, and can simplify the configuration of the apparatus.

To achieve the above object, a voltage measuring apparatus according to the present invention comprises: a capacitor configured of a plurality of capacitor elements and divided at a connection point into two sections of the same capacitance; a first switching device for connecting a voltage source to be measured to both terminals of the capacitor; a differential amplifier; a second switching device for connecting both terminals of the capacitor to inputs of the differential amplifier; and a third switch for connecting the connection point in the capacitor to signal reference potential of the differential amplifier in time synchronization with the second switching device.

With the above-mentioned configuration, the accuracy of voltage measurement can be easily improved by alleviating the above-described performance problems.

A voltage measuring apparatus according to another aspect of the invention comprises: a capacitor; a first group of switching devices for selectively connecting both terminals of each of a plurality of voltage sources to be measured to both terminals of the capacitor; and a second switching device connected to both terminals of the capacitor.

With the above-mentioned configuration, the voltage measuring apparatus for making measurements on a plurality of voltage sources can be made simple in configuration, and furthermore, the accuracy of voltage measurement can be easily improved by alleviating the above-described performance problems.

A voltage measuring apparatus according to still another aspect of the invention comprises: (N+1) voltage detection terminals connected to N (N is an integer) series connected voltage sources; a capacitor; a first multiplexer for selectively connecting odd-numbered ones of the voltage detection terminals to one terminal of the capacitor; a second multiplexer for selectively connecting even-numbered ones of the voltage detection terminals to the other terminal of the capacitor; a second switching device connected to both terminals of the capacitor; and a polarity corrector for making voltages from odd-numbered ones of the voltage sources the same in polarity as voltages from even-numbered ones of the voltage sources.

With the above-mentioned configuration, the voltage measuring apparatus for measuring the voltage of each individual one of stacked voltage sources can be made simple in configuration, and furthermore, the accuracy of voltage measurement can be easily improved by alleviating the above-described performance problems.

The novel features of the invention will be hereinafter fully described and particularly pointed out in the appended claims, and the construction and details of the invention, together with other objects and features thereof, will become better understood and appreciated by reference to the following detailed description when considered in conjunction with the accompanying drawings.

It will be appreciated that all or part of the drawings are purely diagrammatic for illustrative purposes and do not necessarily present faithful depictions of the actual relative sizes and positions of the illustrated elements.

BEST MODE FOR CARRYING OUT THE INVENTION

Hereinafter, preferred embodiments of the voltage measuring apparatus of the present invention will be described below with reference to FIGS 1 to 22.

Embodiment 1

Figure 1:
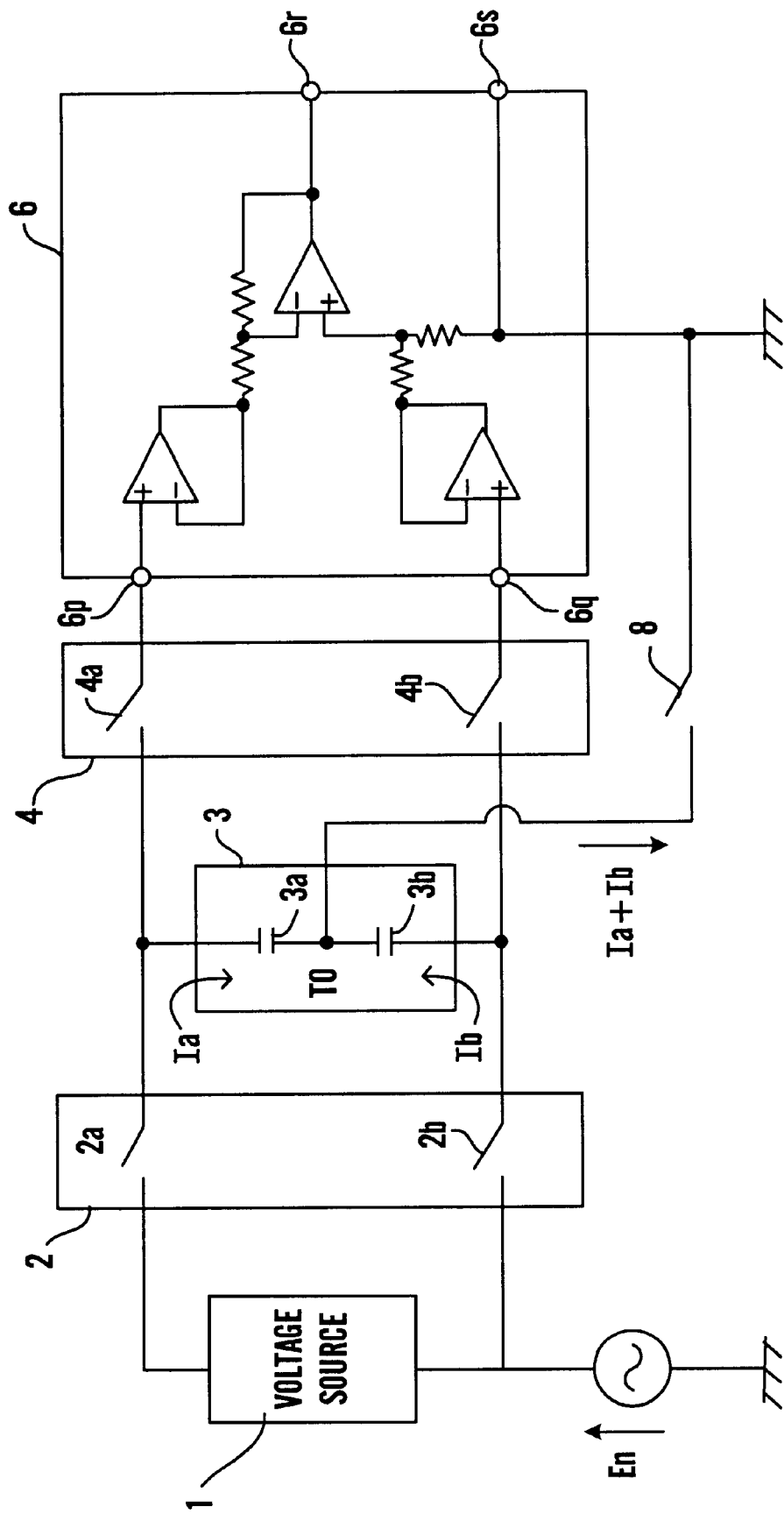
FIG. 1 is a circuit diagram showing a configuration of a voltage measuring apparatus in a first embodiment of the present invention.

FIG. 1 is a circuit diagram showing a configuration of a voltage measuring apparatus in a first embodiment of the present invention.

As shown in FIG. 1, the voltage measuring apparatus of this embodiment comprises a first switching device 2 connected to both ends of a voltage source 1 to be measured and for connecting the voltage source 1 to both terminals of the following capacitor 3, and the capacitor 3 for temporarily storing the voltage of the voltage source 1. Further, the voltage measuring apparatus of the present embodiment comprises a second switching device 4 for connecting both the terminals of the capacitor 3 to a differential amplifier 6, and a third switch 8 for connecting an intermediate connection point T0 in the capacitor 3 to a signal reference potential of the differential amplifier 6 in time synchronization with the first switching device 4.

The first switching device 2 is preferably constructed from two semiconductor switching elements. More specifically, the first switching device 2 comprises two switches 2a and 2b which operate in interlocking fashion with each other.

The capacitor 3 is constructed from two series connected capacitor elements 3a and 3b having the same capacitance. The intermediate connection point T0 in the capacitor 3 is coupled to the signal reference potential, i.e., ground potential, for the differential amplifier 6 via the third switch 8.

The second switching device 4 is preferably constructed of two semiconductor switching elements. More specifically, the second switching device 4 comprises two switches 4a and 4b which operate in interlocking fashion with each other.

The differential amplifier 6 includes the function of a buffer circuit for outputting the voltage stored in the capacitor 3 to the outside as a stable value. Its differential input terminals 6p and 6q are connected to the switches 4a and 4b, respectively, and its voltage output terminal 6r and reference potential terminal 6s are connected to an analog voltmeter or a digital counting circuit having an A/D converter (not shown). The differential amplifier 6 can prevent the occurrence of a common mode error by its differential characteristic as will be described in detail later.

The third switch 8 is preferably constructed of a semiconductor switching element, and turns in time synchronization with the second switching device 4.

In the thus configured voltage measuring apparatus of the present embodiment, leakage currents Ia and Ib occur due to the capacitance in the OFF-state of the first switching device 2 from the moment that the second switching device 4 and the third switch 8 turn on. However, in the voltage measuring apparatus of the present embodiment, the leakage currents Ia and Ib pass through the respective capacitor elements 3a and 3b and coupled to ground potential via the third switch 8. More specifically, in the case that the leakage current Ia and Ib flow in directions indicated by arrows in FIG. 1, for example, the leakage current Ia generates a positive offset voltage across the capacitor element 3a, and the leakage current Ib generates a negative offset voltage across the capacitor element 3b. These offset voltages are equal in magnitude because of the symmetry of the circuit with respect to the intermediate connection point T0, and cancel each other by the differential characteristic of the differential amplifier 6. As a result, in the voltage measuring apparatus of the present embodiment, the common mode error does not occur.

Figure 24:
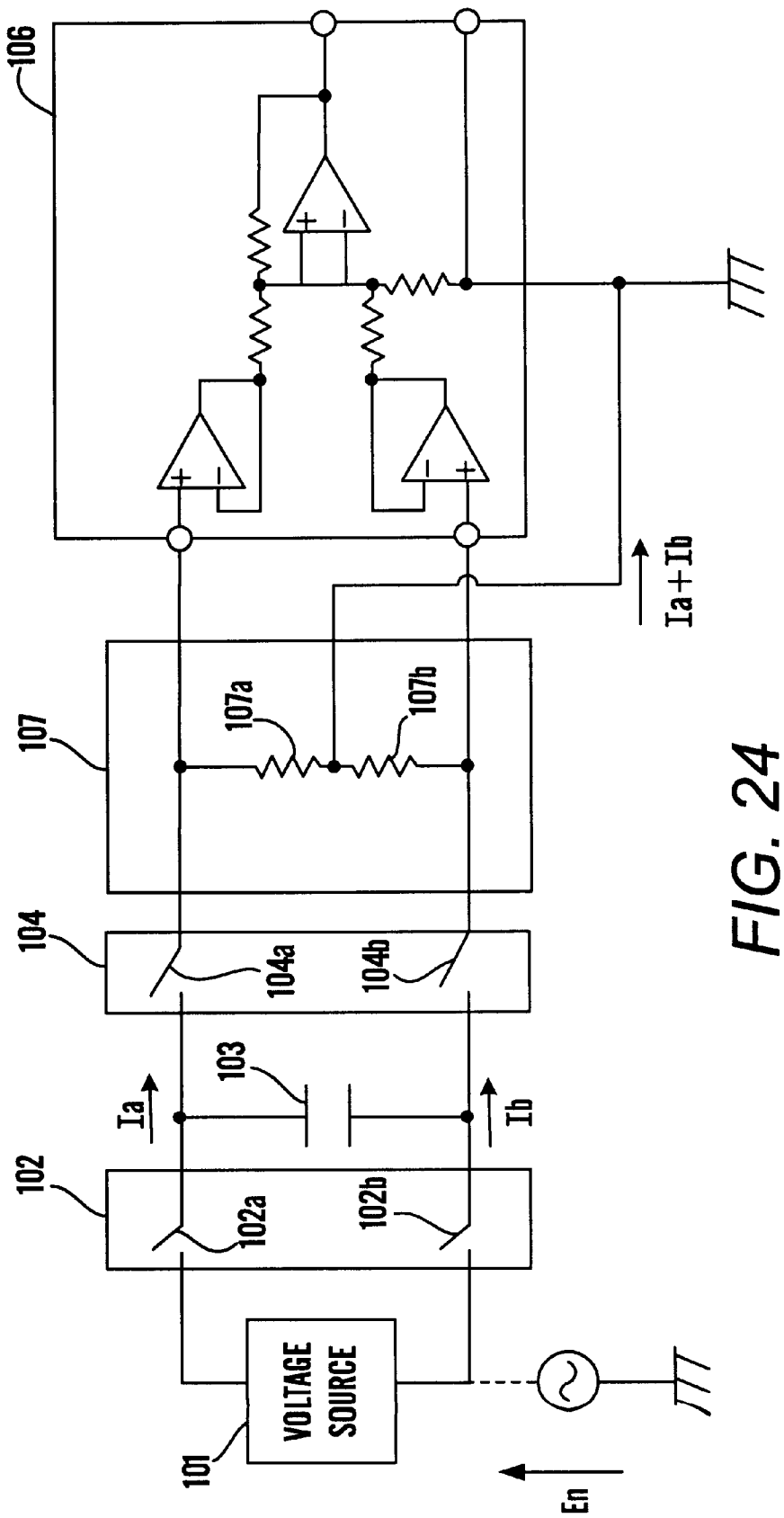
FIG. 24 is a circuit diagram showing a configuration of a third conventional voltage measuring apparatus.

Further, in the voltage measuring apparatus of the present embodiment, the increase of the settling time in the third conventional apparatus shown in FIG. 24 can be solved. The reason is that in the voltage measuring apparatus of the present embodiment, the settling time in the differential amplifier 6 is determined by the capacitance in the OFF-state of the first switching device 2 and the resistance in the ON-state of the third switch 8, but the resistance in the ON-state is far smaller than the resistance value of the resistor in the aforementioned conventional apparatus. Accordingly, in the voltage measuring apparatus of the present embodiment, the settling time can be easily reduced, and thus the performance of the measuring apparatus can be dramatically improved compared with the aforementioned conventional apparatus.

As for the voltage leakage error encountered in the third conventional apparatus, since the resistor that caused the leakage error is dispensed with in the voltage measuring apparatus of the present embodiment, the voltage leakage error problem can be eliminated by selecting a differential amplifier having a small input bias current in accordance with the externally connected counting circuit.

The above-mentioned description has dealt with the configuration that uses a capacitor consisting of two series connected capacitor elements, but the number of capacitor elements need not necessarily be not limited to two. The only requirement is that the capacitor be configured to have a plurality of capacitor elements that can be divided between two sections so that each capacitor section has the same capacitance when viewed from one (intermediate) connection point connected to the third switch.

The voltage source to be measured here includes a battery, a battery pack, a DC power supply, an AC power supply, a sensor, or the like.

Embodiment 2

Figure 2:
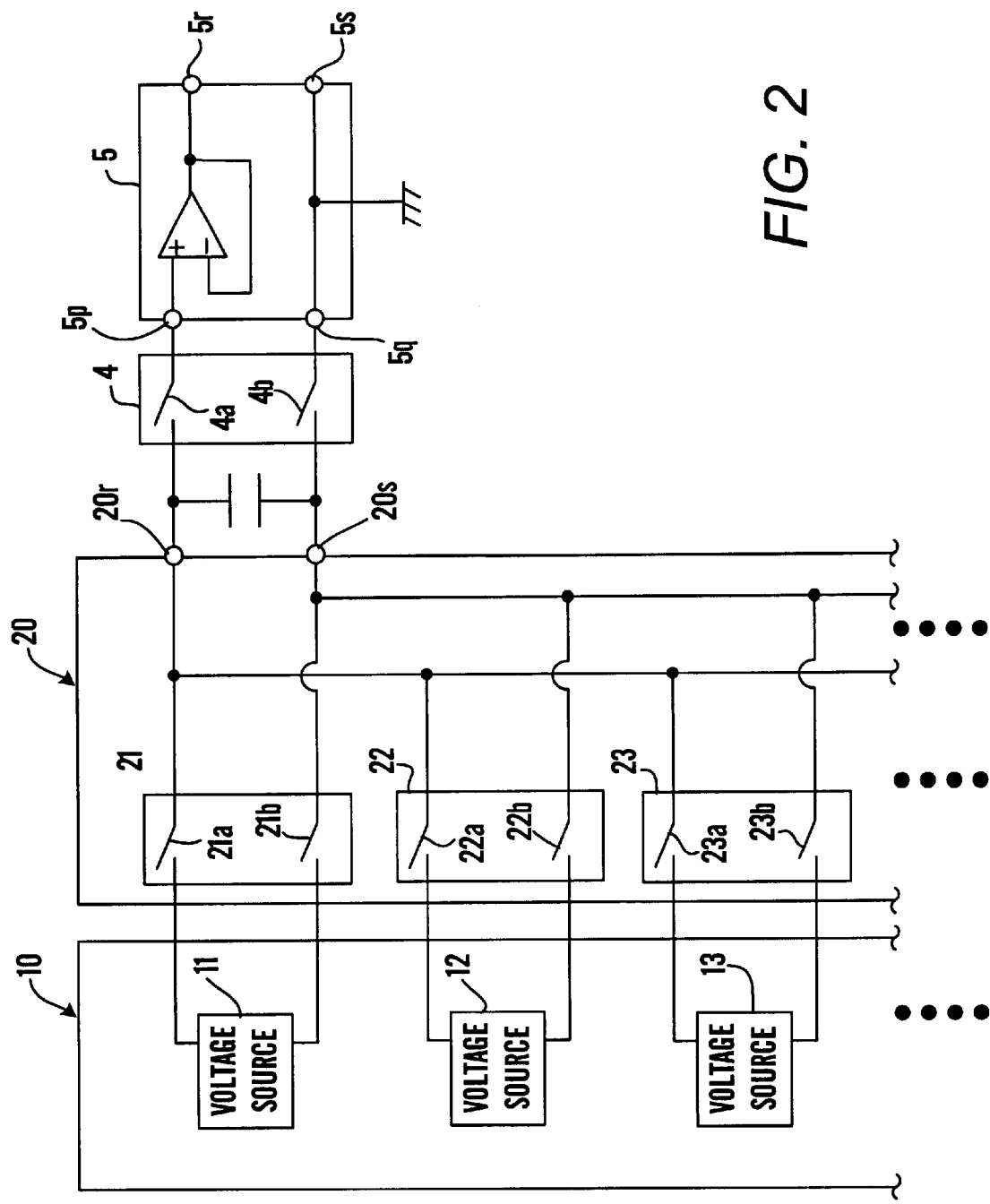
FIG. 2 is a circuit diagram showing a configuration of a voltage measuring apparatus in a second embodiment of the present invention.

FIG. 2 is a circuit diagram showing a configuration of a voltage measuring apparatus in a second embodiment of the present invention. In this embodiment, in the configuration of the voltage measuring apparatus, a first group of switching devices for selectively connecting both terminals of each of a plurality of voltage sources to both terminals of a common capacitor is provided. Other elements and portions are similar to those of the first embodiment, and therefore superposed descriptions on the similar points are omitted.

In FIG. 2, the voltage source 10 to be measured contains a plurality of independent voltage sources 11, 12, 13, and so on. As shown in the same figure, the voltage measuring apparatus of the present embodiment comprises a first group of switching devices 20 consisting of switching devices 21, 22, 23, and so on, connected to the respective voltage sources 11, 12, 13, and so on, a capacitor 7 connected to the first group of switching devices 20, and a buffer circuit 5 connected to the capacitor 7 via the second switching device 4.

The switching devices 21, 22, 23, etc. each have the same function as the first switching device 2 shown in FIG. 1, and the switching device 21, for example, is preferably constructed from two semiconductor switching elements. More specifically, the switching device 21 comprises two switches 21a and 21b which operate in interlocking fashion with each other. These switching devices 21, 22, 23, etc. are connected to the capacitor 7 and the second switching device 4 via common output terminals 20r and 20s.

The capacitor 7 temporarily stores the voltage from the voltage source selected by the first group of switching devices 20.

The buffer circuit 5 is a high input impedance circuit, and outputs the voltage stored in the capacitor 7 to the outside as a stable value. Its input terminal 5p and input-side reference potential terminal 5q are connected to the switches 4a and 4b, respectively, and its voltage output terminal 5r and output-side reference potential terminal 5s are connected to an analog voltmeter or a digital counting circuit having an A/D converter (not shown). Here, when the counting circuit is one whose input section has a high input impedance, the buffer circuit 5 may be omitted, and the second switching device 4 may be connected directly to that input section to construct the measuring apparatus.

The operation of the voltage measuring apparatus of the present embodiment will be described below with reference to FIG. 3. The following description assumes that each switch is normally in the OFF-state.

Figure 3:
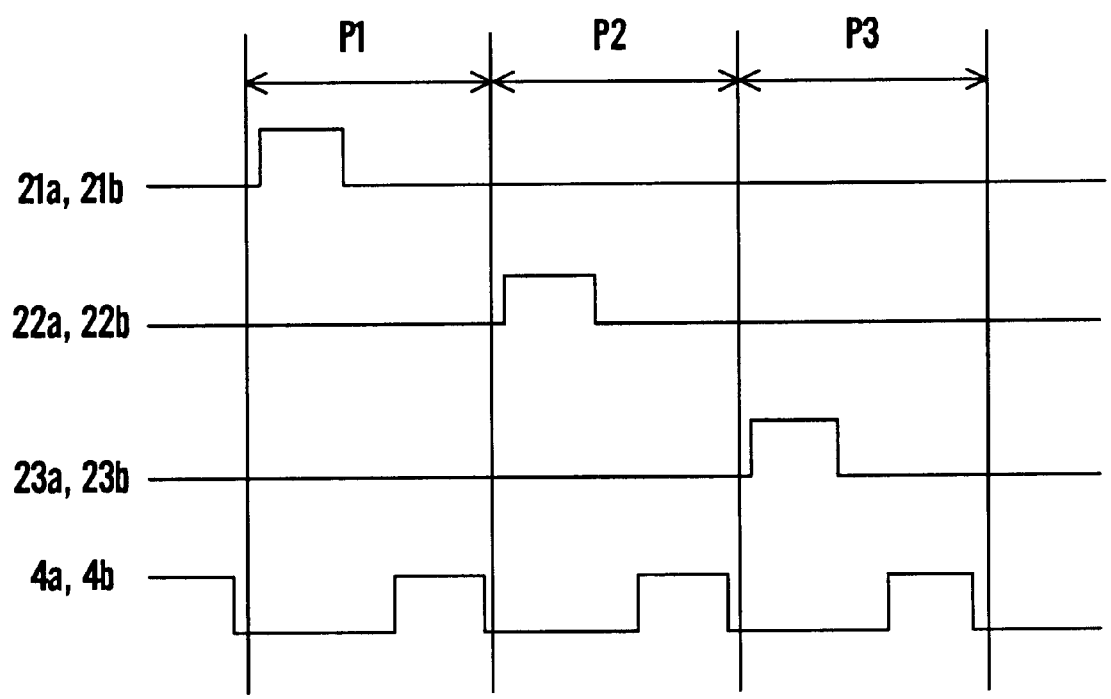
FIG. 3 is a timing chart showing a timing of switching operations for the respective switches in the voltage measuring apparatus shown in FIG. 2.

FIG. 3 is a timing chart showing a timing of switching operations for the respective switches in the voltage measuring apparatus shown in FIG. 2.

As shown in FIG. 3, when the switches 21a and 21b are closed in a period P1, the capacitor 7 is charged with the voltage of the voltage source 11. Next, when the switches 4a and 4b turn on after turning off the switches 21a and 21b, the charged voltage in the capacitor 7, which has been transferred from the voltage of the voltage source 11, is transferred to the buffer circuit 5. The buffer circuit 5 can then produce an output which is input to the external counting circuit. Similarly, in a period P2 the switches 22a and 22b are operated instead of the switches 21a and 21b, and in a period P3 the switches 23a and 23b are operated. In this way, the voltages from the voltage sources 12 and 13 can be obtained in sequence from the buffer circuit 5.

Figure 25:
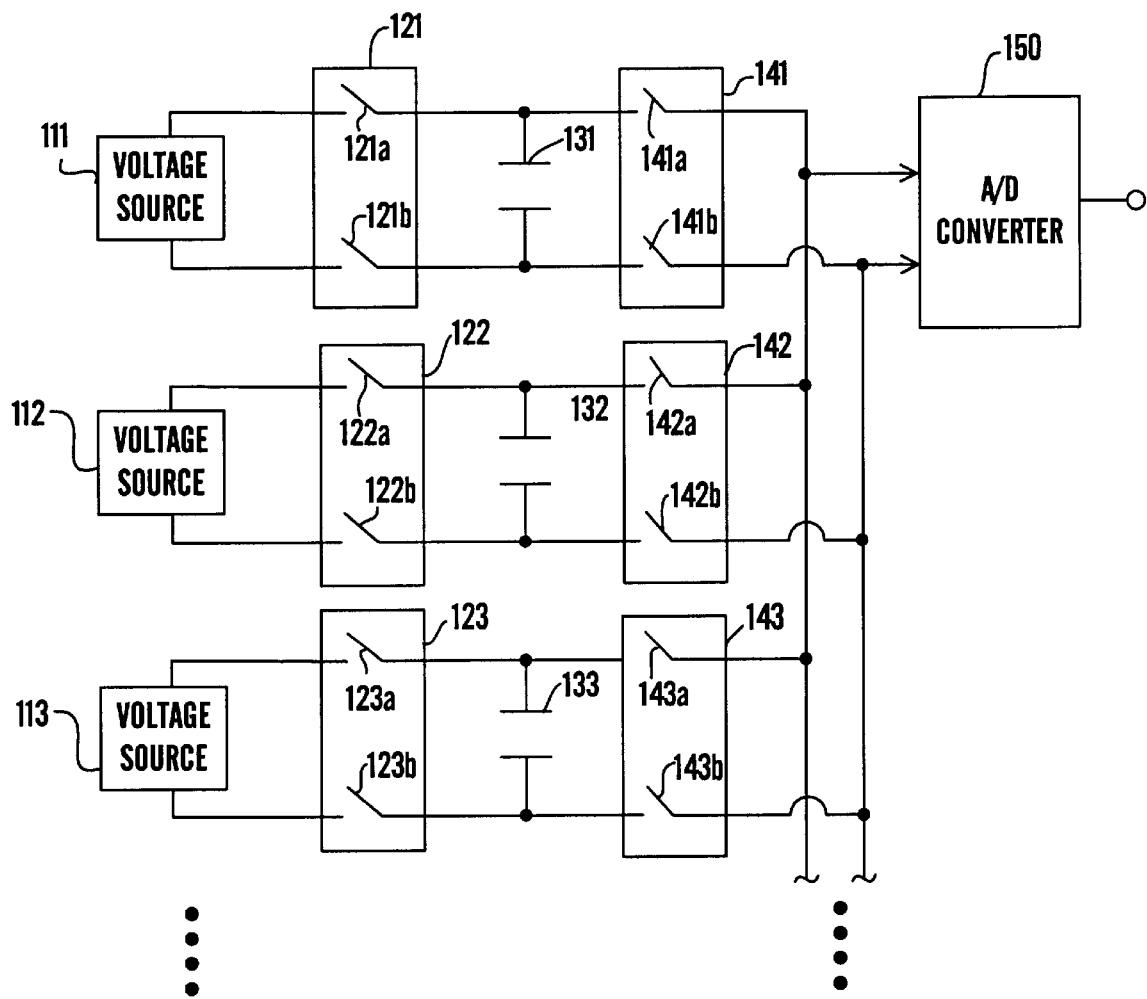
FIG. 25 is a circuit diagram showing the configuration of a fourth conventional voltage measuring apparatus.

As described above, in the voltage measuring apparatus of the present embodiment, only one set of the capacitor 7 and second switching device 4 need be provided irrespective of the number of voltage sources, and thus the configuration of the apparatus can be simplified compared with that of the fourth conventional apparatus shown in FIG. 25.

Embodiment 3

Figure 4:
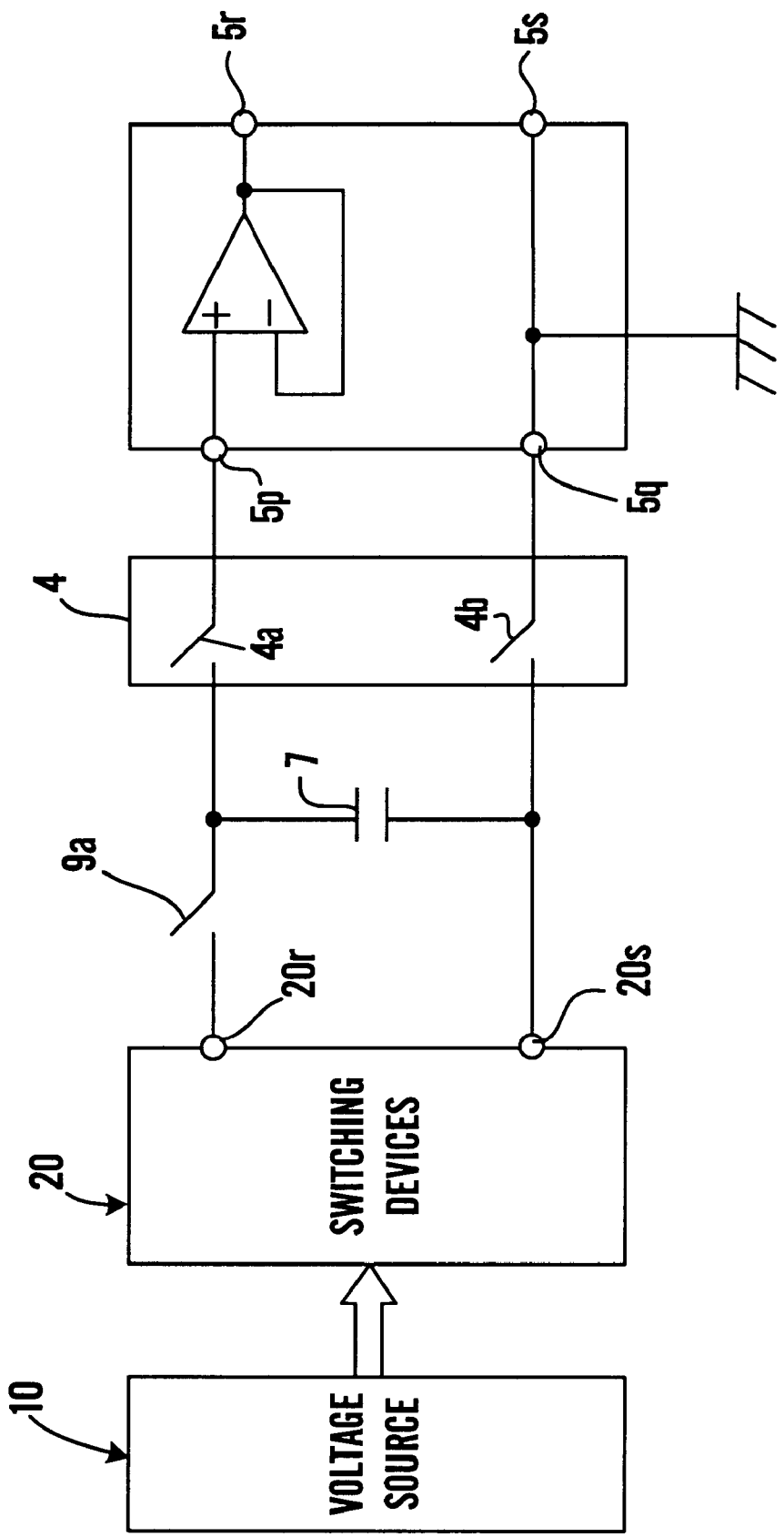
FIG. 4 is a circuit diagram showing a configuration of a voltage measuring apparatus in a third embodiment of the present invention.
Figure 5:
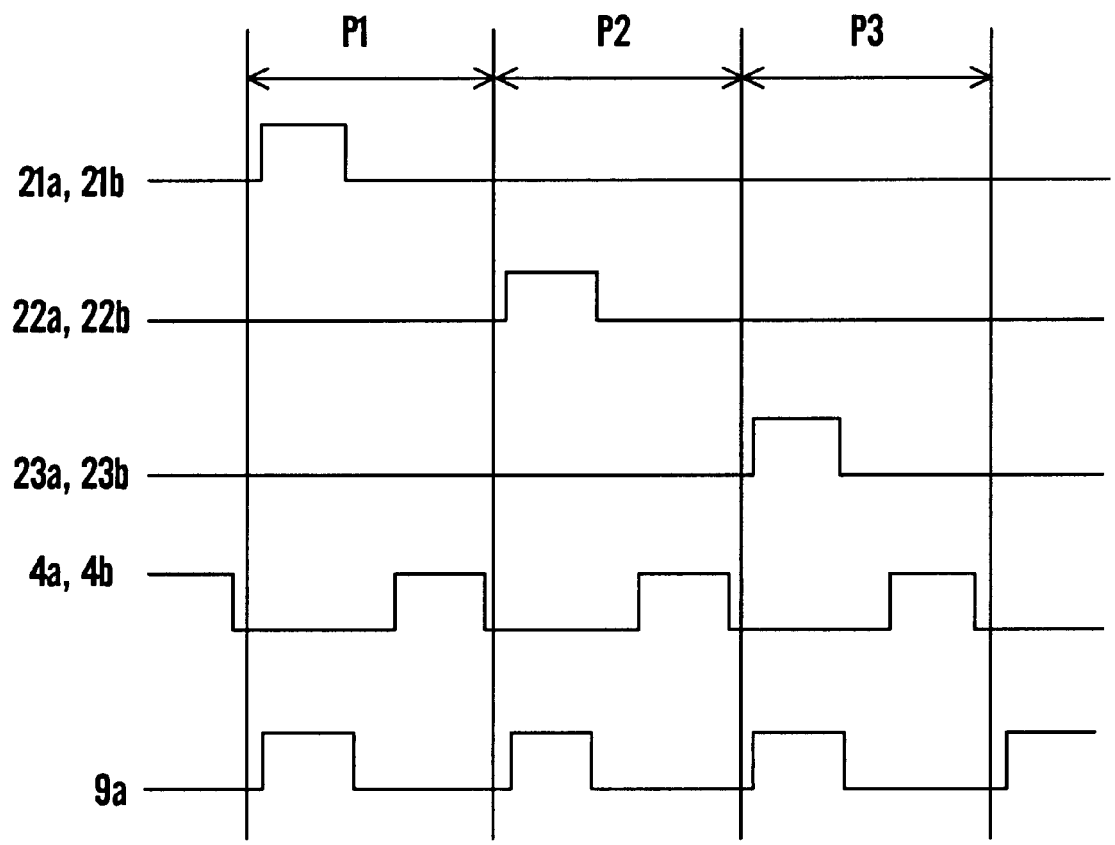
FIG. 5 is a timing chart showing a timing of switching operations for the respective switches in the voltage measuring apparatus shown in FIG. 4.

FIG. 4 is a circuit diagram showing a configuration of a voltage measuring apparatus in a third embodiment of the present invention. FIG. 5 is a timing chart showing a timing of switching operations for the respective switches in the voltage measuring apparatus shown in FIG. 4. In this embodiment, in the configuration of the voltage measuring apparatus, a switch which turns in time synchronization with the first group of switching devices is provided between the first group of switching devices and the capacitor. Other elements and portions are similar to those of the second embodiment, and therefore superposed descriptions on the similar points are omitted.

As shown in FIG. 4, the voltage measuring apparatus of the present embodiment is provided with the switch 9a connected between the first group of switching devices 20 and the capacitor 7. More specifically, the switch 9a is connected to one output terminal of the first group of switching devices 20, one terminal of the capacitor 7, and one end of the switch 4a. This switch 9a turns in time synchronization with each of the switching devices 21, 22, 23, etc. in the first group of switching devices 20. Accordingly, the voltage measuring apparatus of the present embodiment can reduce the common mode error compared with the apparatus of the second embodiment. To explain the reason, the leakage current flowing to the one terminal of the capacitor 7 is proportional to the capacitance in the it OFF-state and the width of voltage change at the switch on that terminal side. In the configuration of the second embodiment shown in FIG. 2, the capacitances on the OFF-state of the respective switching devices 21, 22, 23, etc., are added in parallel to the capacitance of the capacitor 7.

On the other hand, in the voltage measuring apparatus of the present embodiment, the capacitance in the OFF-state of the switch 9a is added in series to the capacitance of the capacitor 7, thus holding the total capacitance in the OFF-state within the capacitance in the OFF-state of each one of the switching devices 21, 22, 23. etc. and the common mode error can thus be reduced.

Embodiment 4

Figure 6:
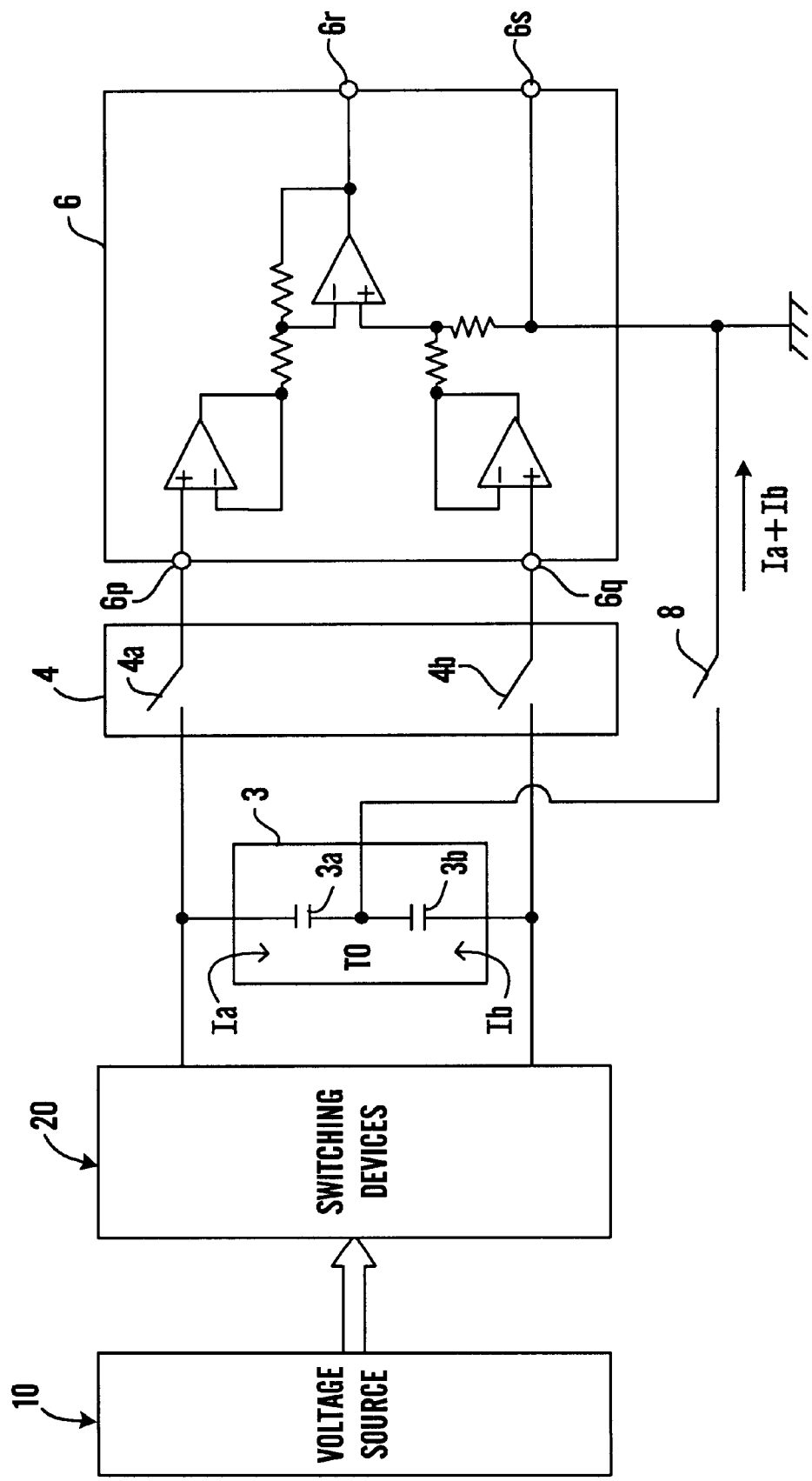
FIG. 6 is a circuit diagram showing a configuration of a voltage measuring apparatus in a fourth embodiment of the present invention.

FIG. 6 is a circuit diagram showing a configuration of a voltage measuring apparatus in a fourth embodiment of the present invention. In this embodiment, in the configuration of the voltage measuring apparatus, both ends of the capacitor consisting of a plurality of capacitor elements are connected to the first group of switching devices, and the intermediate connection point in the capacitor is grounded via a third switch. Further, instead of the buffer circuit, a differential amplifier is connected to the second switching device, so that the common mode error can be further reduced. Other elements and portions are similar to those of the second embodiment, and therefore superposed descriptions on the similar points are omitted.

As shown in FIG. 6, in the voltage measuring apparatus of the present embodiment, the first group of switching device 20 is connected to the capacitor 3 consisting of two capacitor elements 3a and 3b connected in series. The intermediate connection point T0 in the capacitor 3 is connected to ground potential via the third switch 8, like the first embodiment. Further, the differential amplifier 6, which is a differential input type buffer circuit, is connected to the second switching device 4.

With the above-mentioned configuration, in the voltage measuring apparatus of the present embodiment, the leakage currents Ia and Ib described with reference to FIG. 1 are passed through the respective capacitor elements 3a and 3b and coupled to ground potential via the third switch 8. As a result, in the voltage measuring apparatus of the present embodiment, like the first embodiment, the offset voltages due to the leakage currents Ia and Ib are canceled out by the differential characteristic of the deferential amplifier 6, and thus the common mode error does not occur.

Embodiment 5

Figure 7:
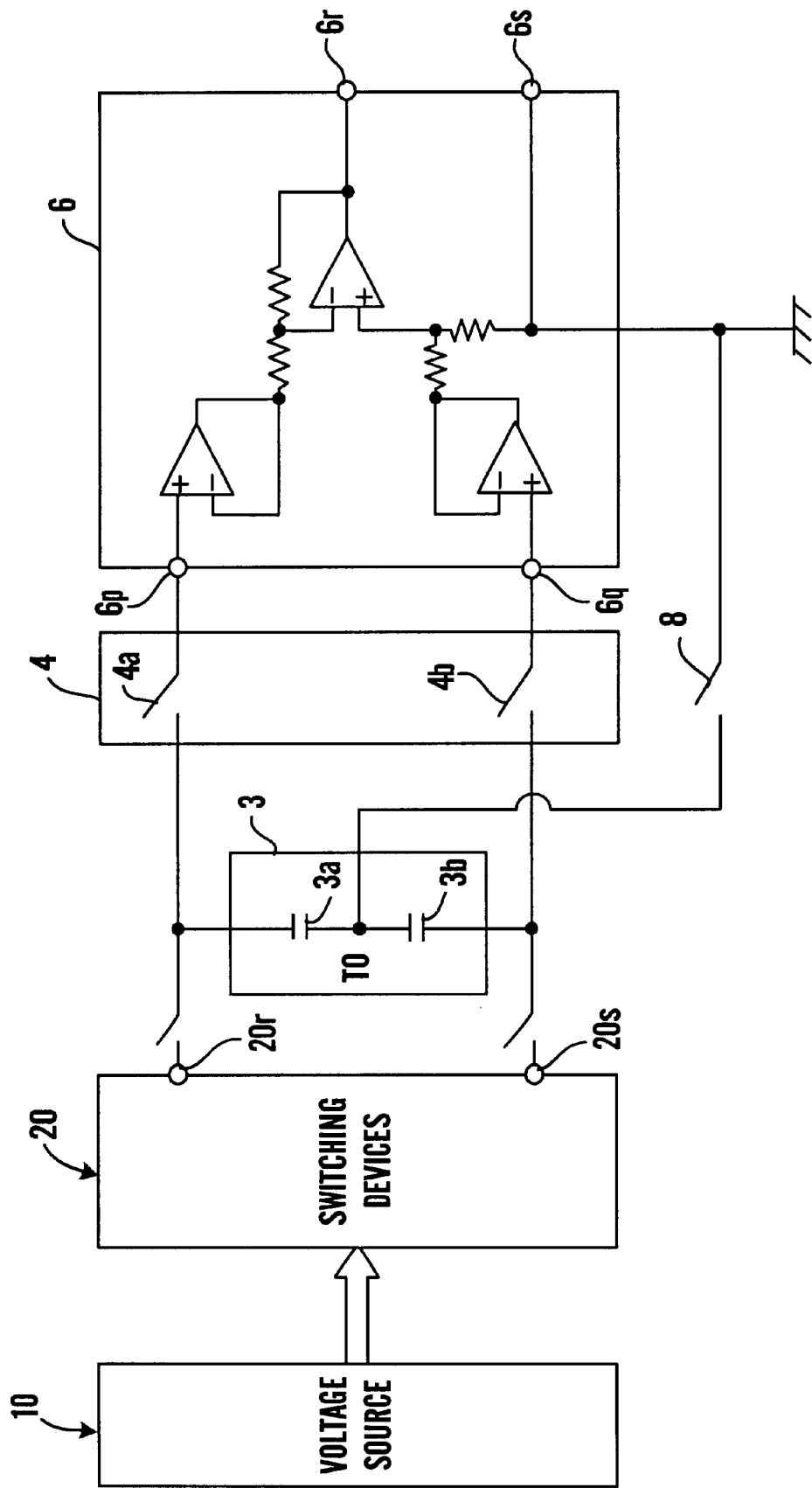
FIG. 7 is a circuit diagram showing a configuration of a voltage measuring apparatus in a fifth embodiment of the present invention.

FIG. 7 is a circuit diagram showing a configuration of a voltage measuring apparatus in a fifth embodiment of the present invention. In this embodiment, in the configuration of the voltage measuring apparatus, a pair of switches which turn in time synchronization with the first group of switching devices are provided between the first group of switching devices and the capacitor. Other elements and portions are similar to those of the fourth embodiment, and therefore superposed descriptions on the similar points are omitted.

As shown in FIG. 7, the voltage measuring apparatus of the present embodiment is provided with a pair of switches 9a and 9b connected between the first group of switching devices 20 and the capacitor 3. These switches 9a and 9b operate in interlocking fashion with each other, and turn in time synchronization with the switching devices 21, 22, 23, etc. in the first group of switching devices 20, as shown by 9a in FIG. 5. With this configuration, the voltage measuring apparatus of the present embodiment can reduce the common mode error compared with the apparatus of the fourth embodiment. To explain the reason, in the configuration of the fourth embodiment shown in FIG. 6, the circuit symmetry is defined by the symmetry between the OFF capacitances of each of the switching devices 21, 22, 23, etc. and between the capacitances of the capacitor elements 3a and 3b, but in reality, a cancellation error occurs due to variations among parts. To reduce this cancellation error, it will be better to reduce the leakage currents that cause the error from the viewpoint of circuit configuration than to increase the precision of the parts themselves. Accordingly, in the voltage measuring apparatus of the present embodiment, the provision of the switches 9a and 9b achieves a similar effect to that obtained with the switch 9a in the third embodiment, and serves to reduce the common mode error compared with the fourth embodiment.

Embodiment 6

Figure 8:
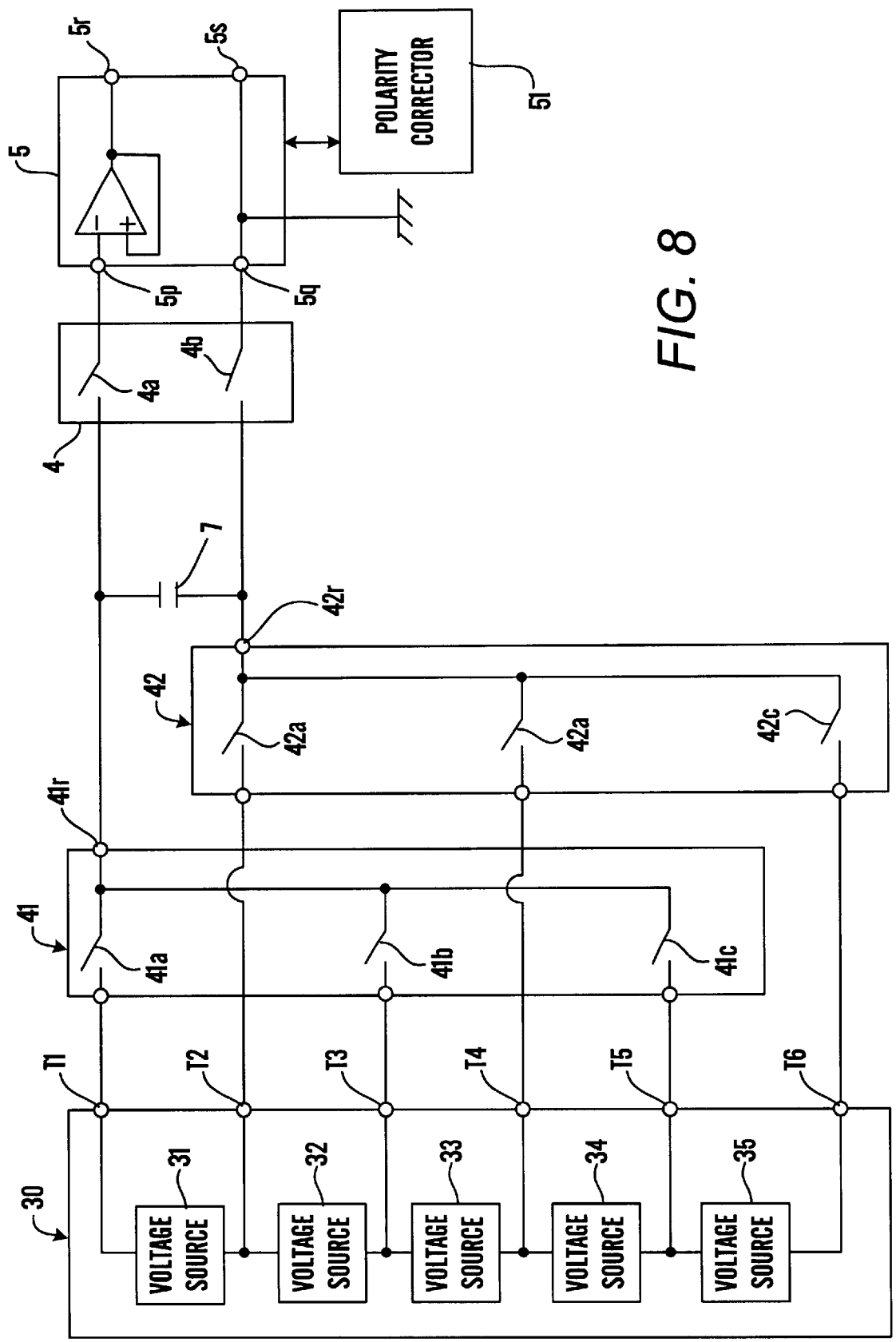
FIG. 8 is a circuit diagram showing a configuration of a voltage measuring apparatus in a sixth embodiment of the present invention.

FIG. 8 is a circuit diagram showing a configuration of a voltage measuring apparatus in a sixth embodiment of the present invention. In this embodiment, the voltage measuring apparatus is constructed to measure the voltage of each individual one of a plurality of series connected voltage sources constituting a stacked type voltage source. Other elements and portions are similar to those of the second embodiment, and therefore superposed descriptions on the similar points are omitted.

In FIG. 8, the voltage source 30 to be measured comprises N (N is an integer), for example, five voltage sources 31 to 35 are connected in series, and a specific example of such an electrical apparatus is a battery pack constructed from a plurality of battery cells connected in series.

As shown in the same figure, the voltage measuring apparatus of the present embodiment comprises six voltage detection terminals T1 to T6 connected to the voltage source 30, and a capacitor 7 for temporarily storing the voltage from each of the voltage sources 31 to 35. The voltage measuring apparatus of the present embodiment further comprises a first multiplexer 41 for selectively connecting odd-numbered voltage detection terminals T1, T3, and T5 to one terminal of the capacitor 7, and a second multiplexer 42 for selectively connecting even-numbered voltage detection terminals T2, T4, and T6 to the other terminal of the capacitor 7. Furthermore, the voltage measuring apparatus of the present embodiment comprises a buffer circuit 5, connected to the capacitor 7 via the second switching device 4, for outputting the voltage stored in the capacitor 7 to the outside, and a polarity corrector 51 for correcting the voltage polarity of a signal to be output from the buffer circuit 5.

The first multiplexer 41 comprises switches 41a, 41b, and 41c, each operating independently of the others, with one end of each switch connected to the one of the odd-numbered voltage detection terminals T1, T3, and T5, respectively. These switches 41a, 41b, and 41c are connected via a common output terminal 41r to one terminal of the capacitor 7 as well as to one end of the switch 4a.

Likewise, the second multiplexer 42 comprises switches 42a, 42b, and 42c, each operating independently of the others, with one end of each switch connected to the one of the even-numbered voltage detection terminals T2, T4, and T6, respectively. These switches 42a, 42b, and 42c are connected via a common output terminal 42r to the other terminal of the capacitor 7 as well as to one end of the switch 4b.

Figure 9:
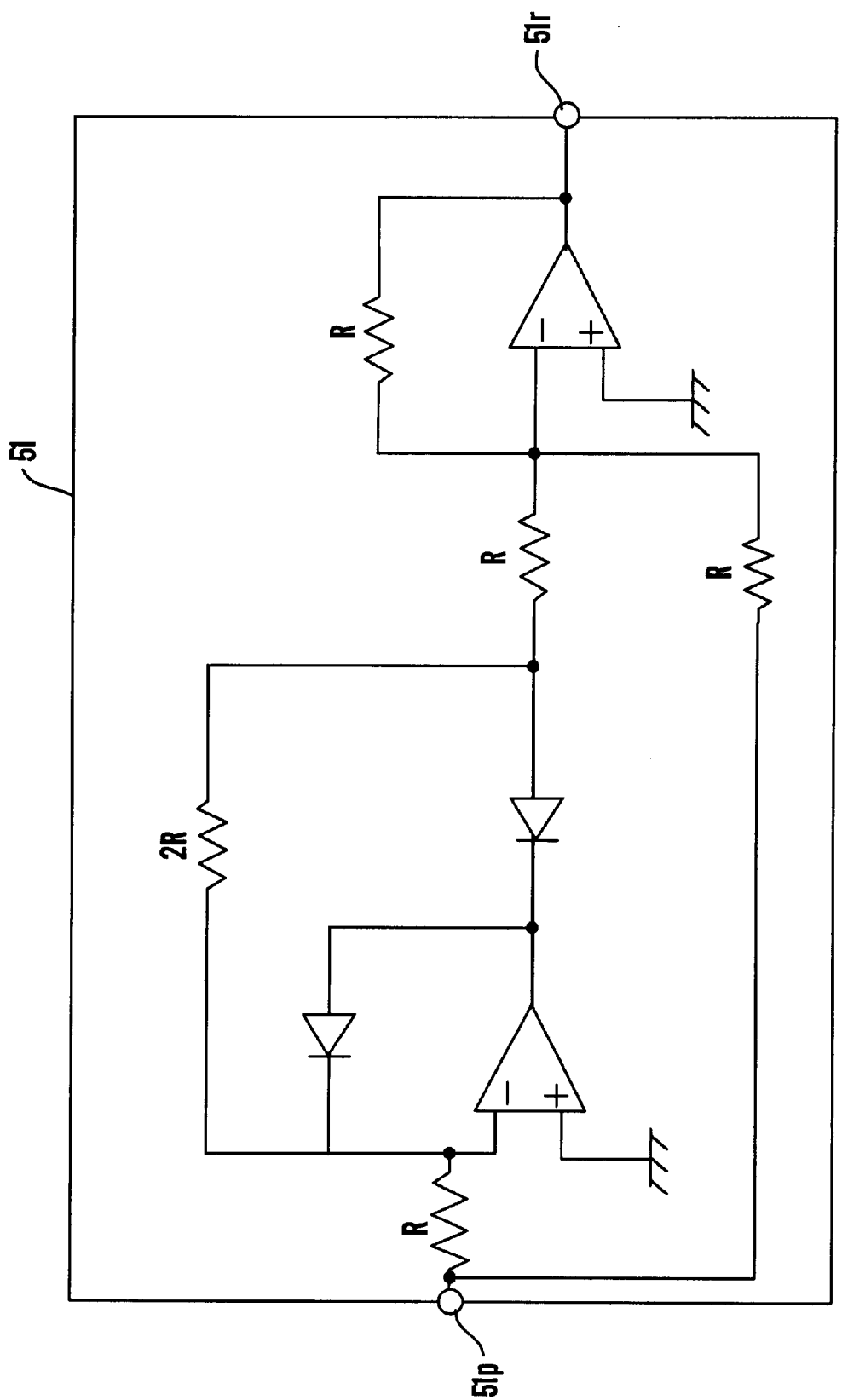
FIG. 9 is a circuit diagram showing a detailed configuration of a polarity corrector shown in FIG. 8.

In the voltage measuring apparatus of the present embodiment, the voltage from each of the even-numbered voltage sources 32 and 34, whose polarity is reversed with respect to the voltage from each of the odd-numbered voltage sources 31, 33 and 35, is input to the buffer circuit 5 via the capacitor 7 and second switching device 4. Accordingly, in the voltage measuring apparatus of the present embodiment, the polarity corrector 51 is connected to the buffer circuit 5 to make the voltage polarity of the detected voltage the same between the odd-numbered voltage sources 31, 33, and 35 and the even-numbered voltage sources 32 and 34 when outputting the output signal from the buffer circuit 5. A specific configuration example of the polarity corrector 51 is shown in FIG. 9. As shown in the same figure, the polarity corrector 51 is configured of a well known absolute value circuit and has the function of making the output signal of the buffer circuit 5 always the same in voltage polarity. Input terminal 51p and output terminal 51r of the absolute value circuit 51 are connected to the voltage output terminal 5r of the buffer circuit 5 and the input part of the aforementioned counting circuit, respectively. This absolute value circuit is valid for the single-polarity voltage source 30 such as a battery. The polarity corrector 51 may be configured, not of the analog circuit shown in FIG. 9, but of such a digital circuit as to ignore the polarity output bit of a bipolar input A/D converter.

The operation of the voltage measuring apparatus of the present embodiment will be described below with reference to FIG. 10. The following description assumes that each switch is normally in the OFF-state.

Figure 10:
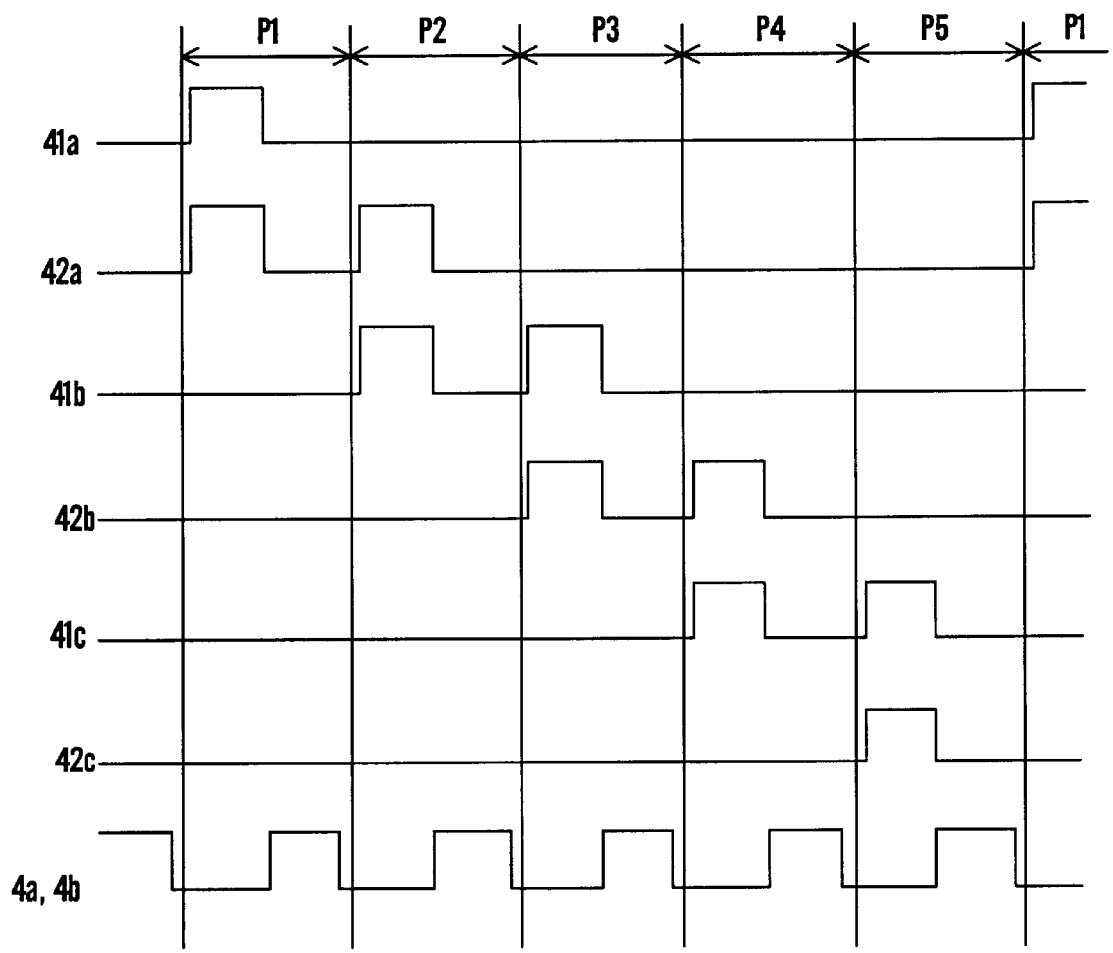
FIG. 10 is a timing chart showing a timing of switching operations for the respective switches in the voltage measuring apparatus shown in FIG. 8.

FIG. 10 is a timing chart showing a timing of switching operations for the respective switches in the voltage measuring apparatus shown in FIG. 8.

As shown in FIG. 10, when the switches 41a and 42a are closed in a period P1, the capacitor 7 is charged with the voltage of the voltage source 31. Next, when the switches 4a and 4b turn on after turning off the switches 41a and 42a, the charged voltage in the capacitor 7, namely, the voltage of the voltage source 31 is transferred to the buffer circuit 5. The switches 41a to 41c, 42a to 42c and their driving circuit are, as a matter of course, electrically isolated from each other. In the voltage measuring apparatus of the present embodiment, since the first and second multiplexers 41, 42 and the second switching device 4 do not turn on simultaneously, the voltage from the voltage source 31 is transferred to the buffer circuit 5 for measurement in an electrically isolated manner. In this way, multiplexing is performed in sequence by next operating the switches 42a and 41b in a period P2, then the switches 41b and 42b in a period P3, and so on.

As described in the above, in the voltage measuring apparatus of the present embodiment, the voltage from each individual one of the voltage sources 31 to 35 in the stacked type voltage source 30 is stored in sequence in the capacitor 7 by using the first and second multiplexers 41 and 42. Thus, in the voltage measuring apparatus of the present embodiment, the configuration of the voltage measuring apparatus for making the measurements can be simplified.

Embodiment 7

Figure 11:
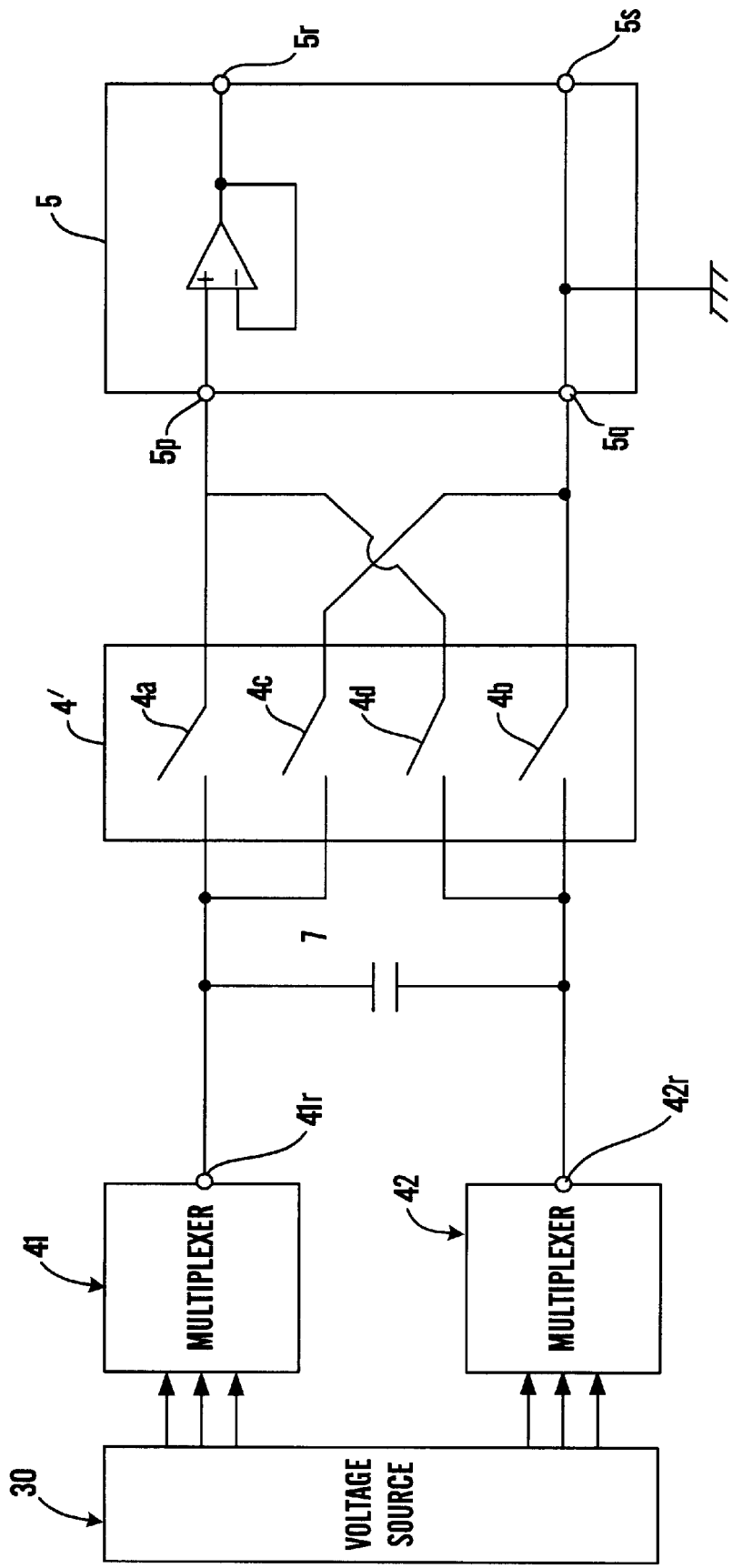
FIG. 11 is a circuit diagram showing a configuration of a voltage measuring apparatus in a seventh embodiment of the present invention.
Figure 12:
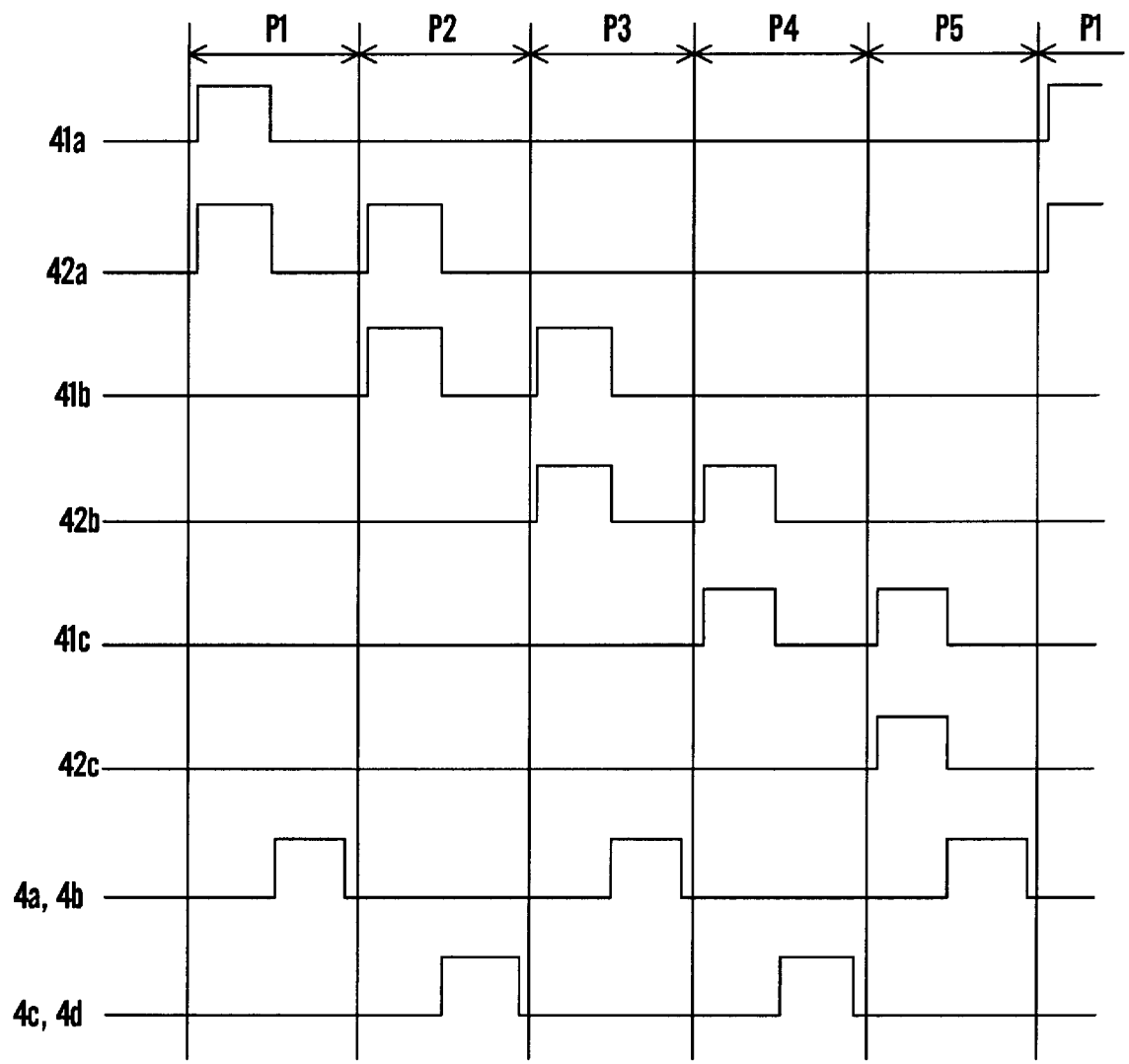
FIG. 12 is a timing chart showing a timing of switching operations for the respective switches in the voltage measuring apparatus shown in FIG. 11.

FIG. 11 is a circuit diagram showing a configuration of a voltage measuring apparatus in a seventh embodiment of the present invention. FIG. 12 is a timing chart showing a timing of switching operations for the respective switches in the voltage measuring apparatus shown in FIG. 11. In this embodiment, in the configuration of the voltage measuring apparatus, the absolute value circuit is replaced by polarity reversing switches provided in the second switch to provide the second switch with the polarity selection function. Other elements and portions are similar to those of the sixth embodiment, and therefore superposed descriptions on the similar points are omitted.

As shown in FIG. 11, in the voltage measuring apparatus of the present embodiment, the second switching device 4' is provided with the polarity reversing switches 4c and 4d as well as the switches 4a and 4b. These polarity reversing switches 4c and 4d function in a manner similar to the aforementioned polarity corrector 51 and act to make the output signal of the buffer circuit 5 always the same in voltage polarity. More specifically, as shown in FIG. 12, the switches 4a, 4b and the polarity reversing switches 4c, 4d alternately turn on during periods when the respective switches 41a to 41c and 42a to 42c in the first and second multiplexers 41 and 42 turn off. In this way, in the voltage measuring apparatus of the present embodiment, the voltage polarity of the detected voltage can be made the same between the odd-numbered voltage sources 31, 33, and 35 (FIG. 8) and the even-numbered voltage sources 32 and 34

(FIG. 8) when outputting the output signal from the buffer circuit 5. Since the absolute value circuit shown in FIG. 9 can be omitted, as described above, the voltage measuring apparatus of the present embodiment can be simplified in configuration compared with that of the sixth embodiment.

Embodiment 8

Figure 13:
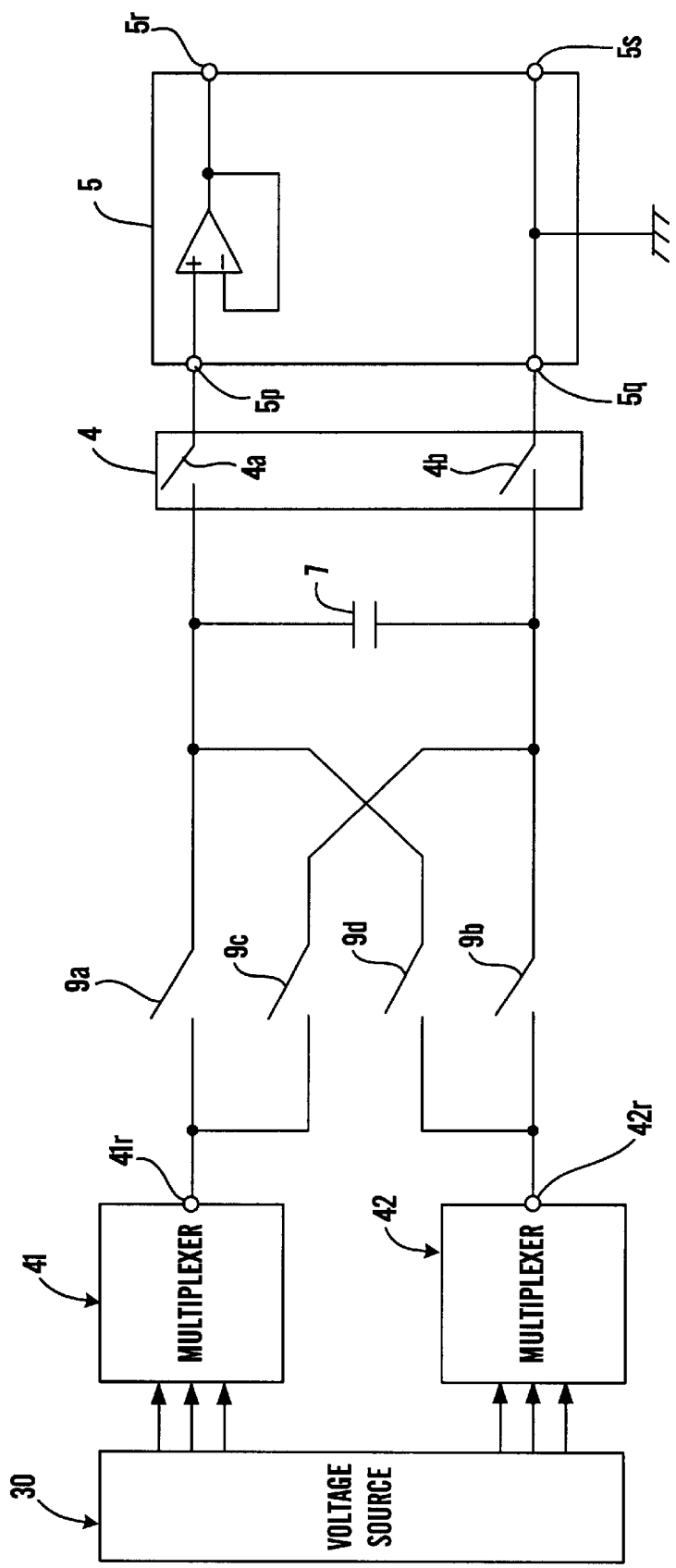
FIG. 13 is a circuit diagram showing a configuration of a voltage measuring apparatus in an eighth embodiment of the present invention.
Figure 14:
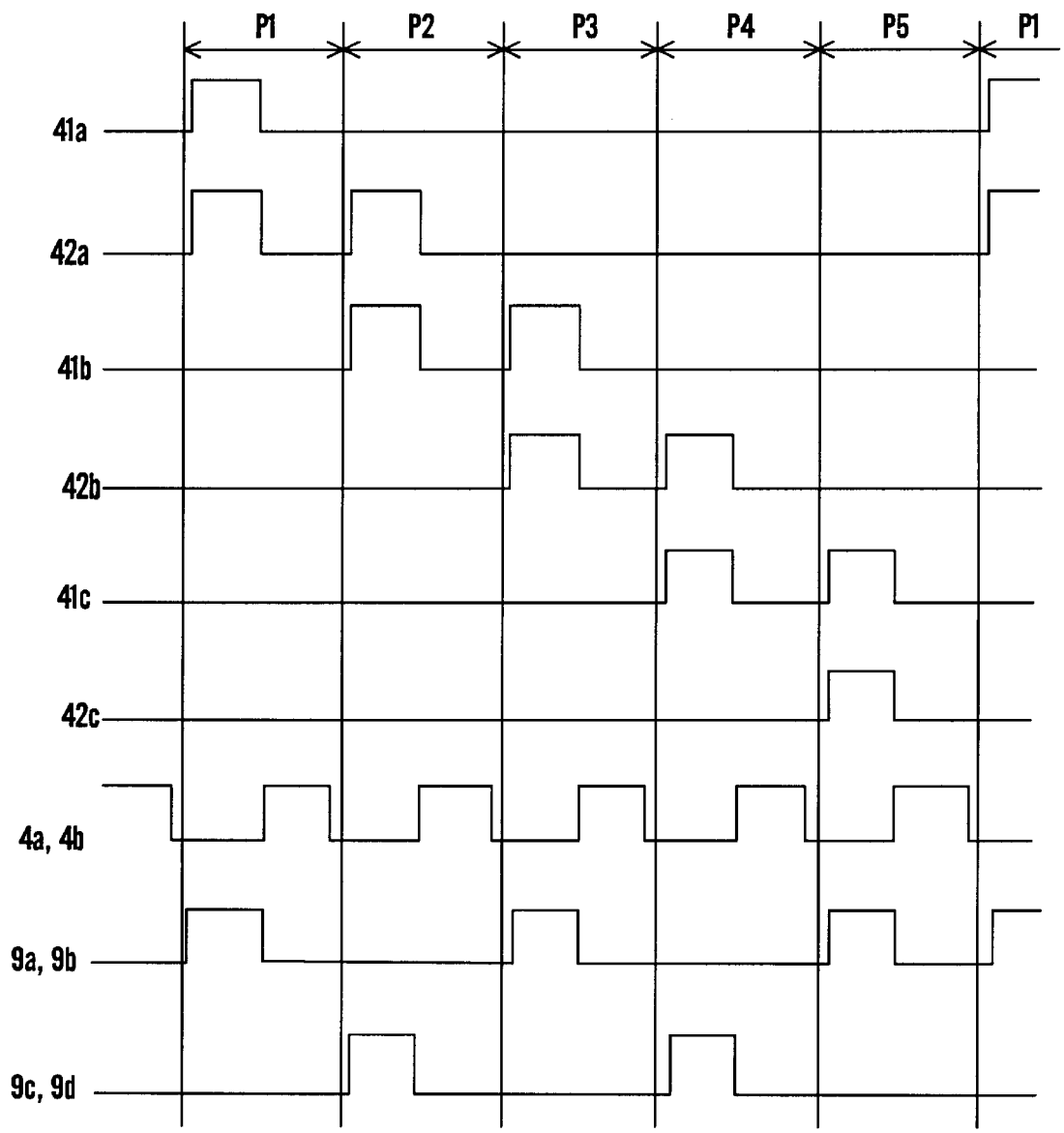
FIG. 14 is a timing chart showing a timing of switching operations for the respective switches in the voltage measuring apparatus shown in FIG. 13.

FIG. 13 is a circuit diagram showing a configuration of a voltage measuring apparatus in an eighth embodiment of the present invention. FIG. 14 is a timing chart showing a timing of switching operations for the respective switches in the voltage measuring apparatus shown in FIG. 13. In this embodiment, in the configuration of the voltage measuring apparatus, the absolute value circuit is replaced by polarity selection switches provided between the first and second multiplexers and the capacitor, and configured to turn in time synchronization with the first and second multiplexers. Other elements and portions are similar to those of the sixth embodiment, and therefore superposed descriptions on the similar points are omitted.

As shown in FIG. 13, in the voltage measuring apparatus of the present embodiment, the switches 9a, 9b, 9c, and 9d for performing the polarity selection are provided between the first and second multiplexers 41, 42 and the capacitor 7. These switches 9a to 9d function in a manner similar to the aforementioned polarity corrector 51 and act to make the output signal of the buffer circuit 5 always the same in voltage polarity. More specifically, as shown in FIG. 14, the switches 9a, 9b and the switches 9c, 9d alternately turn on in time synchronization with the respective switches 41a to 41c and 42a to 42c in the first and second multiplexers 41 and 42. In this way, in the voltage measuring apparatus of the present embodiment, the voltage polarity of the detected voltage can be made the same between the odd-numbered voltage sources 31, 33, and 35 (FIG. 8) and the even-numbered voltage sources 32 and 34 (FIG. 8) when outputting the output signal from the buffer circuit 5. Since the absolute value circuit shown in FIG. 9 can be omitted, as described above, the voltage measuring apparatus of the present embodiment can be simplified in configuration compared with that of the sixth embodiment. Furthermore, in the voltage measuring apparatus of the present embodiment, the common mode error can be reduced as will be described in detail later with reference to FIG. 17. Moreover, since the switches 9a to 9d are provided on the input side (voltage source side) of the capacitor 7, the voltage of the single-polarity voltage source 30 can be measured using the single-polarity capacitor 7.

Embodiment 9

Figure 15:
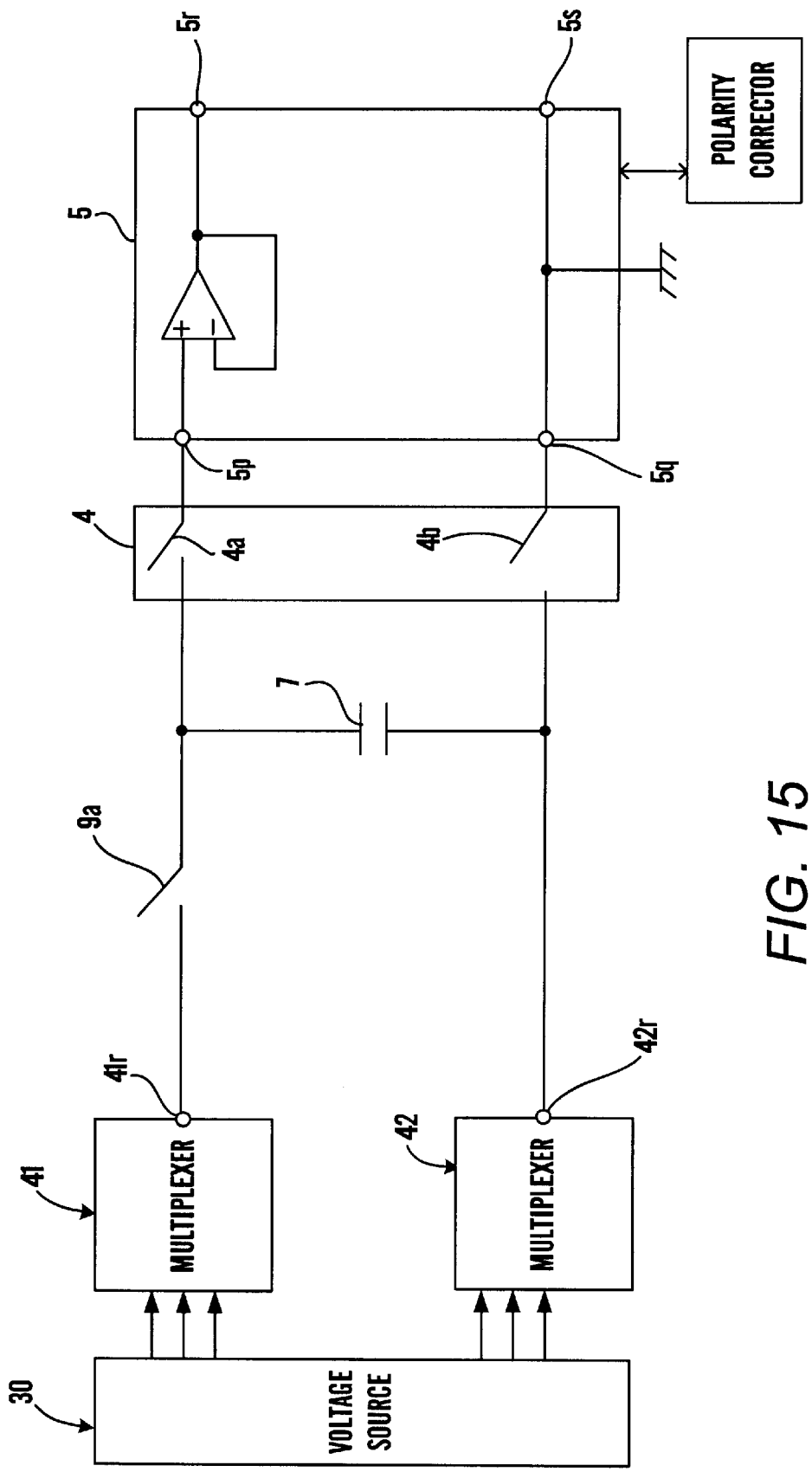
FIG. 15 is a circuit diagram showing a configuration of a voltage measuring apparatus in a ninth embodiment of the present invention.
Figure 16:
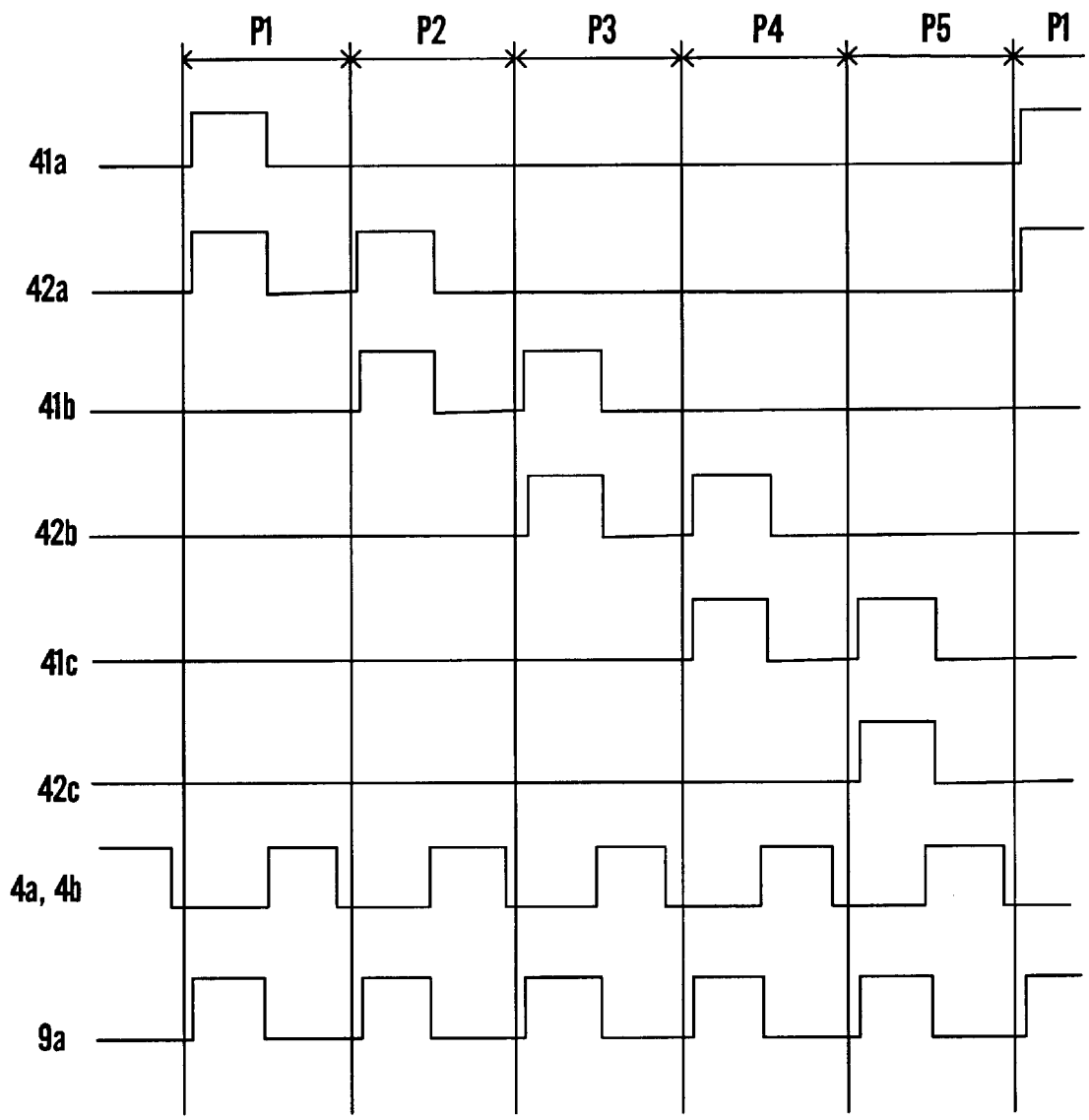
FIG. 16 is a timing chart showing a timing of switching operations for the respective switches in the voltage measuring apparatus shown in FIG. 15.

FIG. 15 is a circuit diagram showing a configuration of a voltage measuring apparatus in a ninth embodiment of the present invention. FIG. 16 is a timing chart showing a timing of switching operations for the respective switches in the voltage measuring apparatus shown in FIG. 15. In this embodiment, in the configuration of the voltage measuring apparatus, a switch configured to turn in time synchronization with the first and second multiplexers is provided between the first and second multiplexers and the capacitor. Other elements and portions are similar to those of the sixth embodiment, and therefore superposed descriptions on the similar points are omitted.

As shown in FIG. 15, the voltage measuring apparatus of the present embodiment is provided with the switch 9a connected between the capacitor 7 and the first and second multiplexers 41, 42. As shown in FIG. 16, this switch 9a turns in time synchronization with each of the switches 41a to 41c and 42a to 42c in the first and second multiplexers 41 and 42.

The effect obtained with the voltage measuring apparatus of the present embodiment will now be described with reference to FIG. 17.

Figure 17:
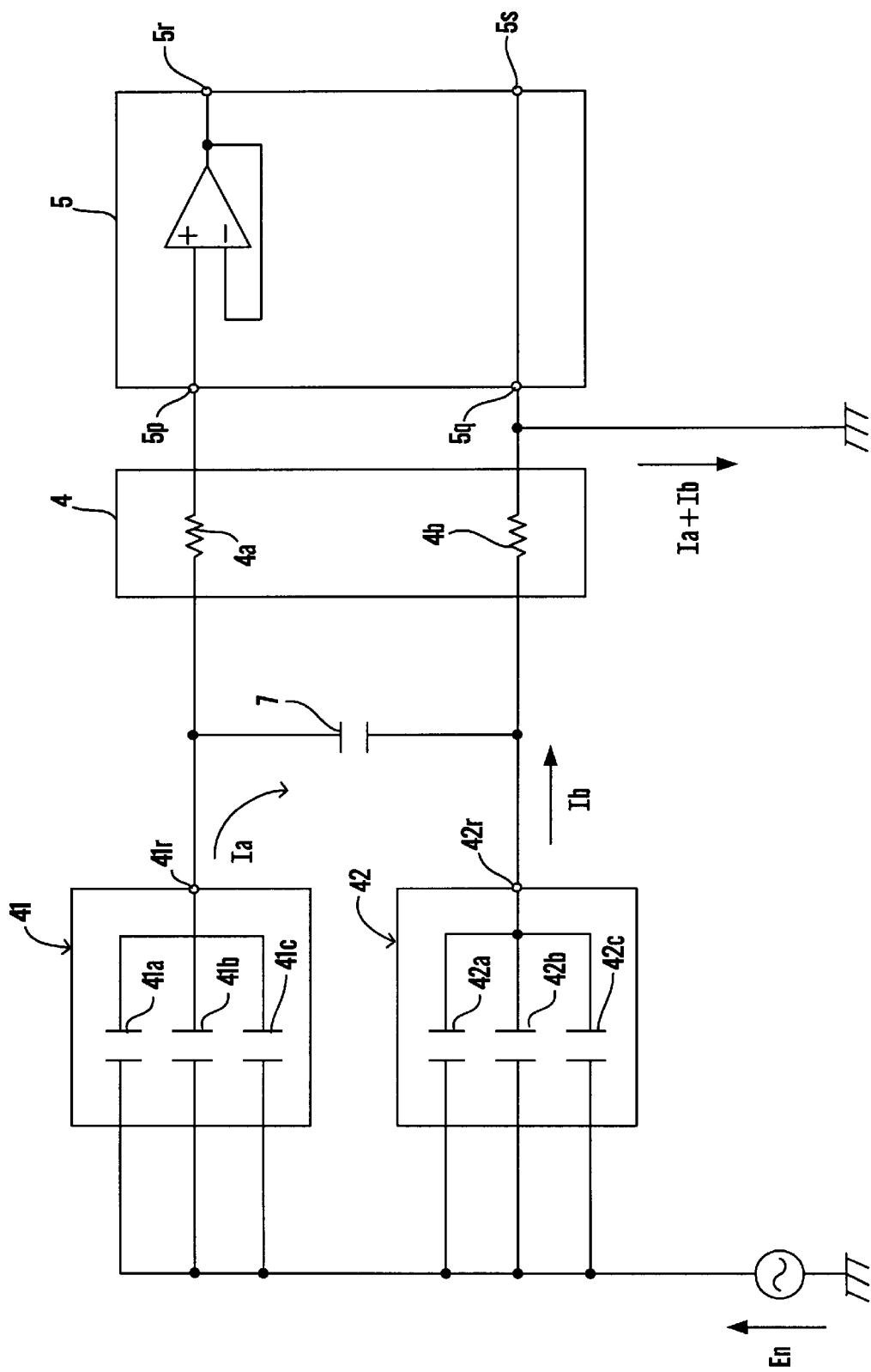
FIG. 17 is an explanatory diagram showing a common mode error that occurs in the voltage measurement of a stacked type voltage source.

FIG. 17 is an explanatory diagram showing a common mode error that occurs in the voltage measurement of the stacked type voltage source.

In FIG. 17, the voltage source 30 (at zero volt in the same figure) has a common mode voltage En with respect to the reference potential (ground potential in the same figure) of the buffer circuit 5. In the condition shown in the same figure, the terminal voltage of the capacitor 7 becomes zero volt with the turning on operation of the first and second multiplexers 41 and 42 and, after turning off the first and second multiplexers 41 and 42, the second switching device 4 turns on. A semiconductor switching element with a low resistance in the ON-state has a relatively large parasitic capacitance when in the OFF-state, as shown in the same figure, the switches 41a to 41c and 42a to 42c in the OFF-state can each be expressed by a capacitor, while the switches 4a and 4b in the ON-state can each be expressed by a resistor. Immediately before the second switching device 4 turns on, the potentials at both terminals of the capacitor 7 are both En, and the charge stored in the capacitance in the OFF-state of each of the switches 41a to 41c and 42a to 42c is zero. When the second switching device 4 turns on thereafter, the potentials at both terminals of the capacitor 7 change in such a manner as to move toward the ground potential. While this change is occurring, leakage currents Ia and Ib occur with the movement of the charge on the capacitance in the OFF-state of each of the switches 41a to 41c and 42a to 42c. These leakage currents Ia and Ib are symmetrical and the same in value.

However, in the buffer circuit 5 shown in FIG. 17, the current flow paths are not symmetrical, and the leakage current Ia is coupled to ground potential by way of the capacitor 7. This generates an offset voltage in the capacitor 7, which is a factor that causes a measurement error. This common mode error is the problem that arises not only from external noise superimposed on the isolated voltage source 30 but also from the inherent difference in potential between the respective voltage sources connected in series. In particular, in a configuration designed to measure a large number of voltage sources, the problem has been magnified by the parallel capacitances in the OFF-state of the large number of switches forming the first and second multiplexers.

By contrast, in the voltage measuring apparatus of the present embodiment, as in the third embodiment, the capacitance in the OFF-state of the switch 9a is added in series to the capacitance of the capacitor 7, reducing the total capacitance in the OFF-state, and thus the common mode error can be reduced. More specifically, when the voltage measuring apparatus of the present embodiment is used for the 24 modules (battery pack) shown in the first conventional apparatus, in the first multiplexer 41 the parallel capacitances in the OFF-state of 13 switches are added in series with the capacitance in the OFF-state of one switch 9a. As a result, when the voltage measuring apparatus of the present embodiment is used, the common mode error can be reduced by a factor of about 13.

Embodiment 10

Figure 18:
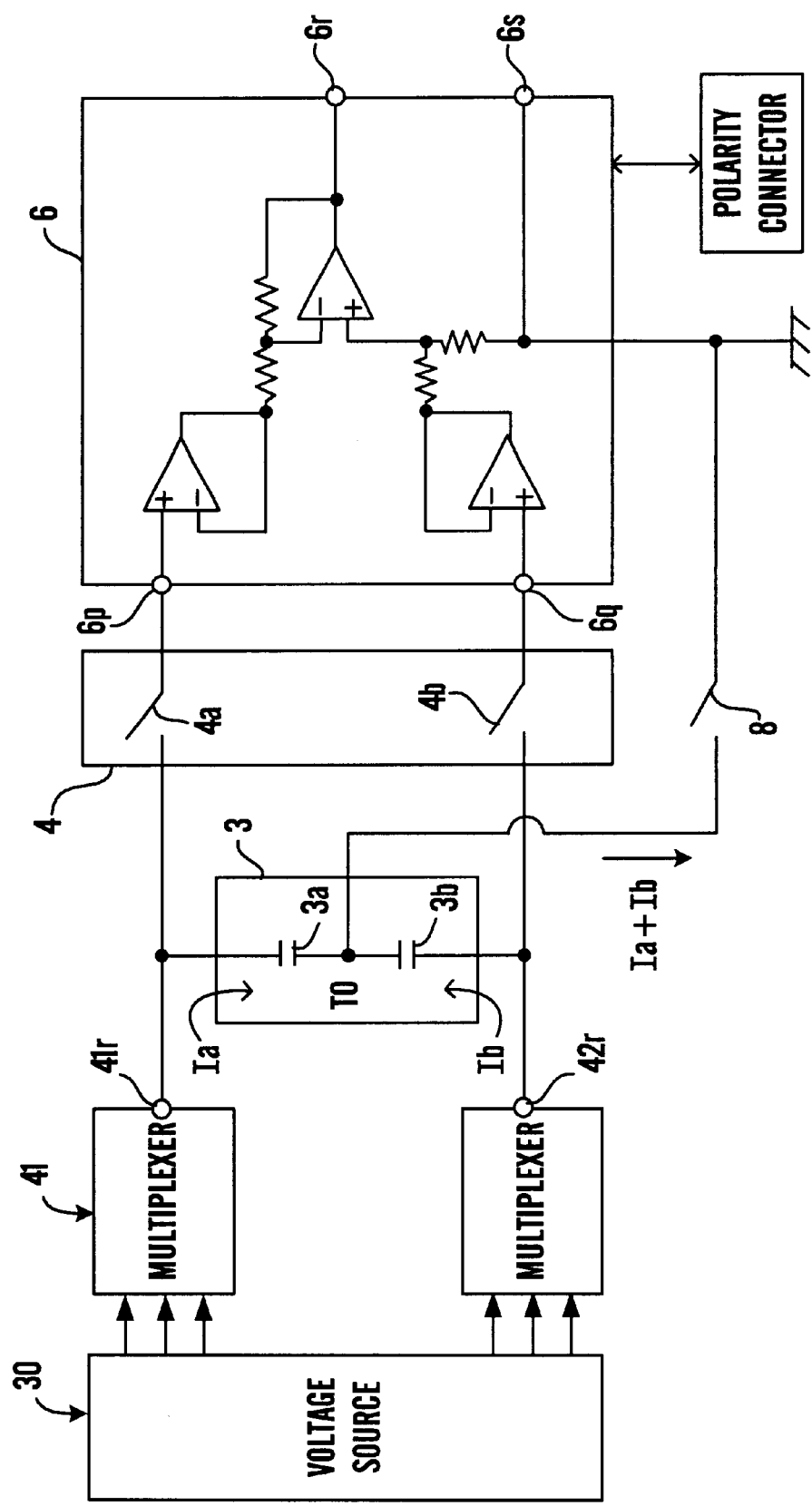
FIG. 18 is a circuit diagram showing a configuration of a voltage measuring apparatus in a 10th embodiment of the present invention.

FIG. 18 is a circuit diagram showing a configuration of a voltage measuring apparatus in a 10th embodiment of the present invention. In this embodiment, in the configuration of the voltage measuring apparatus, the first and second multiplexers are respectively connected to one end and the other end of a capacitor consisting of a plurality of capacitor elements, and an intermediate connection point in the capacitor is grounded via a third switch. Instead of the buffer circuit, a differential amplifier is connected to the second switching device, so as to further reduce the common mode error. Other elements and portions are similar to those of the sixth embodiment, and therefore superposed descriptions on the similar points are omitted.

As shown in FIG. 18, in the voltage measuring apparatus of the present embodiment, the output terminals of the first and second multiplexers 41 and 42 are connected to the capacitor 3 consisting of two series connected capacitor elements 3a and 3b. The intermediate connection point T0 in this capacitor 3 is coupled to ground potential via the third switch 8, like the first embodiment. Further, the differential amplifier 6, which is a differential input type buffer circuit, is connected to the second switching device 4.

With the above-mentioned configuration, in the voltage measuring apparatus of the present embodiment, the leakage currents Ia and Ib described with reference to FIG. 1 are passed through the respective capacitor elements 3a and 3b and coupled to ground potential via the third switch 8. As a result, in the voltage measuring apparatus of the present embodiment, as in the first embodiment, the offset voltages due to the leakage currents Ia and Ib are canceled out by the differential characteristic of the deferential amplifier 6, and thus the common mode error does not occur.

Embodiment 11

Figure 19:
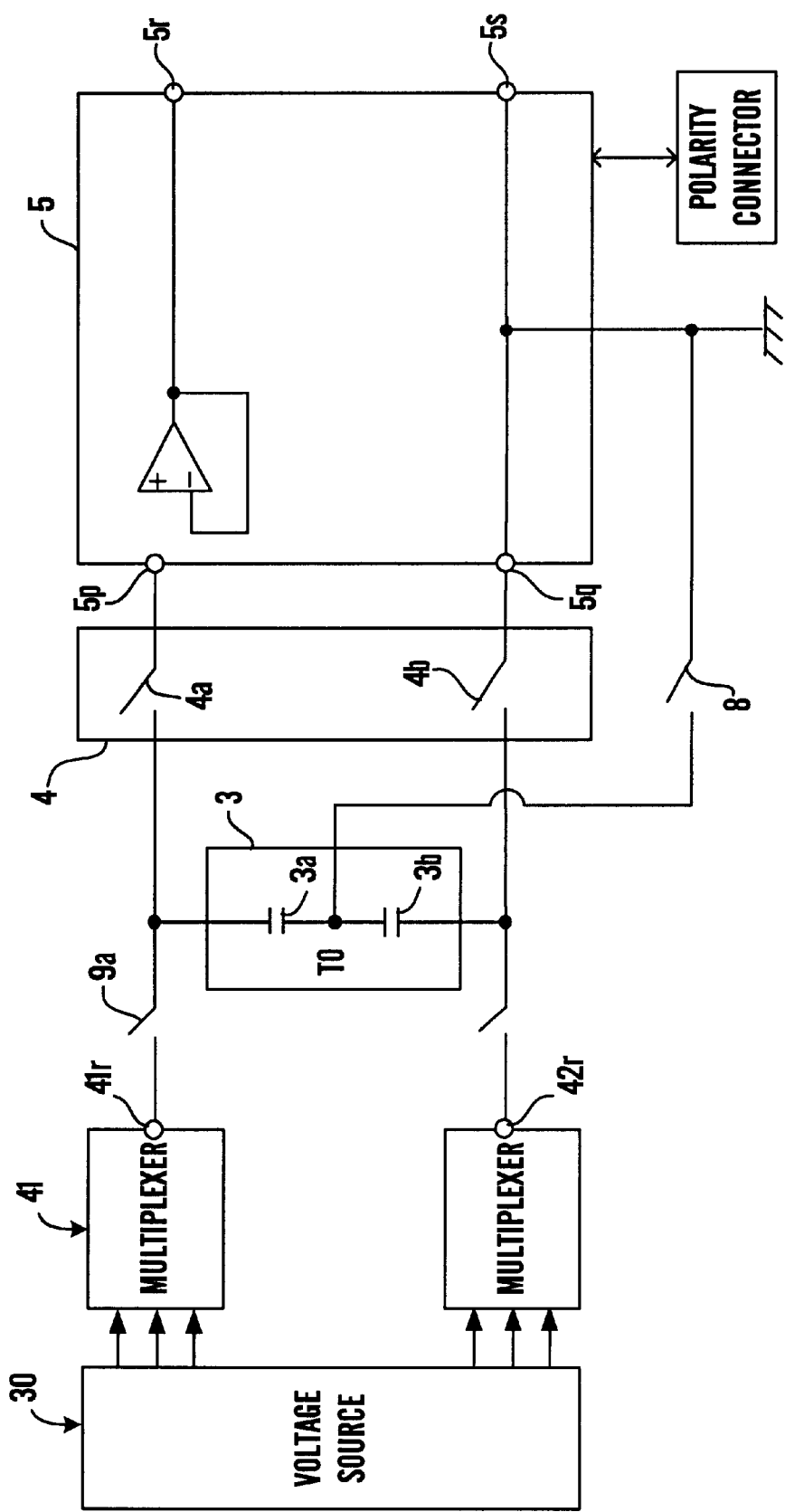
FIG. 19 is a circuit diagram showing a configuration of a voltage measuring apparatus in an 11th embodiment of the present invention.

FIG. 19 is a circuit diagram showing a configuration of a voltage measuring apparatus in an 11th embodiment of the present invention. In this embodiment, in the configuration of the voltage measuring apparatus, a pair of switches which turn in time synchronization with the first and second multiplexers are provided between the first and second multiplexers and the capacitor. Other elements and portions are similar to those of the 10th embodiment, and therefore superposed descriptions on the similar points are omitted.

As shown in FIG. 19, the voltage measuring apparatus of the present embodiment is provided with a switch 9a connected between the first multiplexer 41 and the capacitor element 3a and a switch 9b connected between the second multiplexer 42 and the capacitor element 3b. These switches 9a and 9b operate in interlocking fashion with each other, and turn in time synchronization with the switches 41a to 41c and 42a to 42c in the first and second multiplexers, as shown by 9a in FIG. 16. With this configuration, the voltage measuring apparatus of the present embodiment can reduce the common mode error compared with the apparatus of the 10th embodiment. To explain the reason, in the configuration of the 10th embodiment shown in FIG. 18, the circuit symmetry is defined by the symmetry between the capacitances in the OFF-state of the first and second multiplexers 41 and 42 and between the capacitances of the capacitor elements 3a and 3b, but in reality, a cancellation error occurs due to variations among parts. To reduce this cancellation error, it will be better to reduce the leakage currents that cause the error from the viewpoint of circuit configuration than to increase the precision of the parts themselves. Accordingly, in the voltage measuring apparatus of the present embodiment, the provision of the switches 9a and 9b achieves a similar effect to that obtained with the switch 9a in the ninth embodiment, and serves to reduce the common mode error compared with the 10th embodiment.

Embodiment 12

Figure 20:
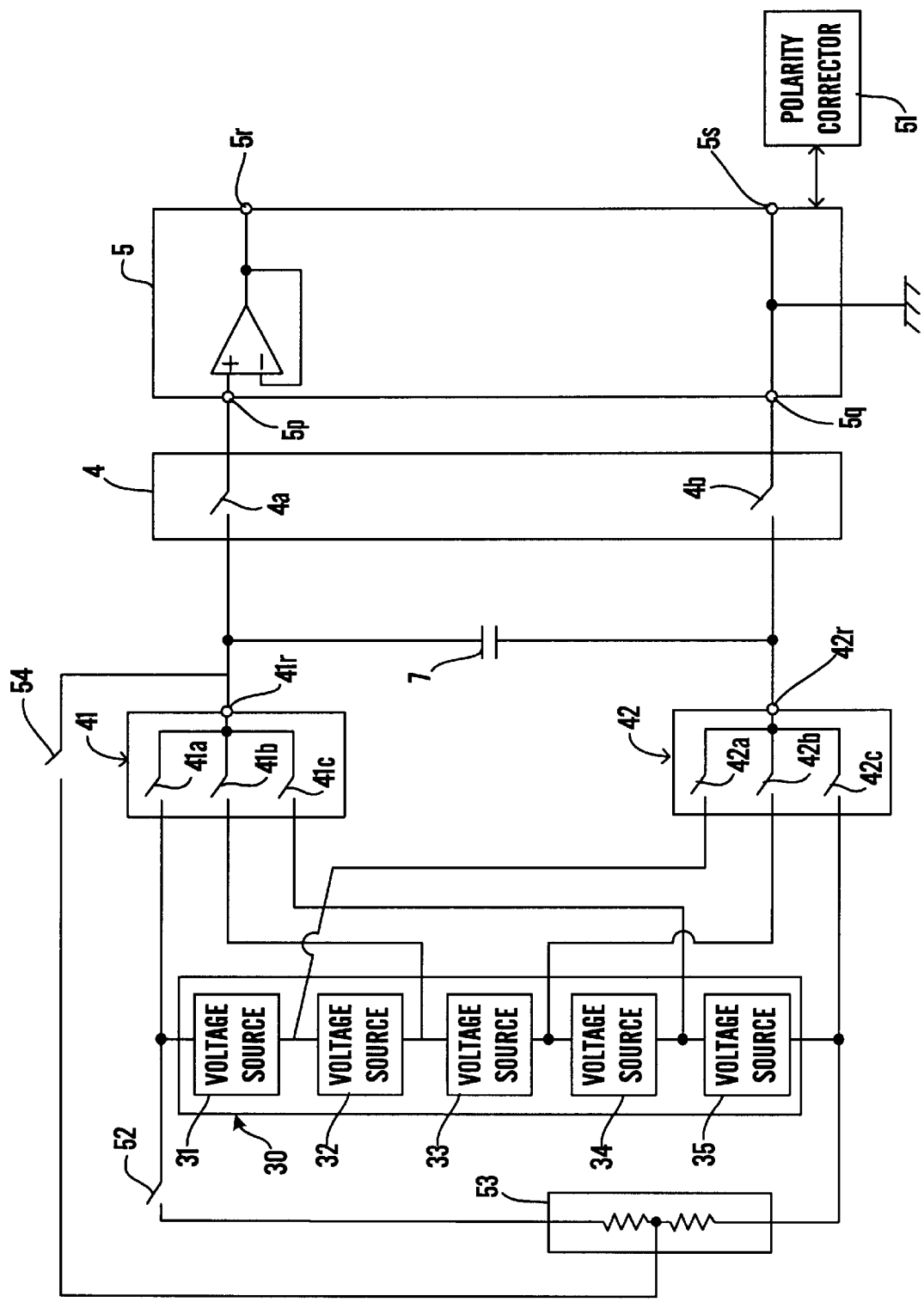
FIG. 20 is a circuit diagram showing a configuration of a voltage measuring apparatus in a 12th embodiment of the present invention.

FIG. 20 is a circuit diagram showing a configuration of a voltage measuring apparatus in a 12th embodiment of the present invention. In this embodiment, in the configuration of the voltage measuring apparatus, a voltage divider for resistive-dividing the voltage appearing across both ends of the voltage source and a multiplexer for taking therein an output voltage of the voltage divider are provided. Further, a switch is provided between the voltage source and the voltage divider. Other elements and portions are similar to those of the sixth embodiment, and therefore superposed descriptions on the similar points are omitted.

As shown in FIG. 20, the voltage measuring apparatus of the present embodiment is configured so that the voltage across both ends of the series connection of the voltage sources 31 to 35 is input to the resistive voltage divider 53 via the switch 52, and so that multiplexing is performed using the switch 54 and switch 42c. In the voltage measuring apparatus of the present embodiment, by setting the division ratio of the resistive voltage divider 53 to N:1, the output of the buffer circuit 5 can be set optimum for the measuring range. Further, when making no voltage measurements, power can be conserved by setting the switch 52 in the OFF-state.

Embodiment 13

Figure 21:
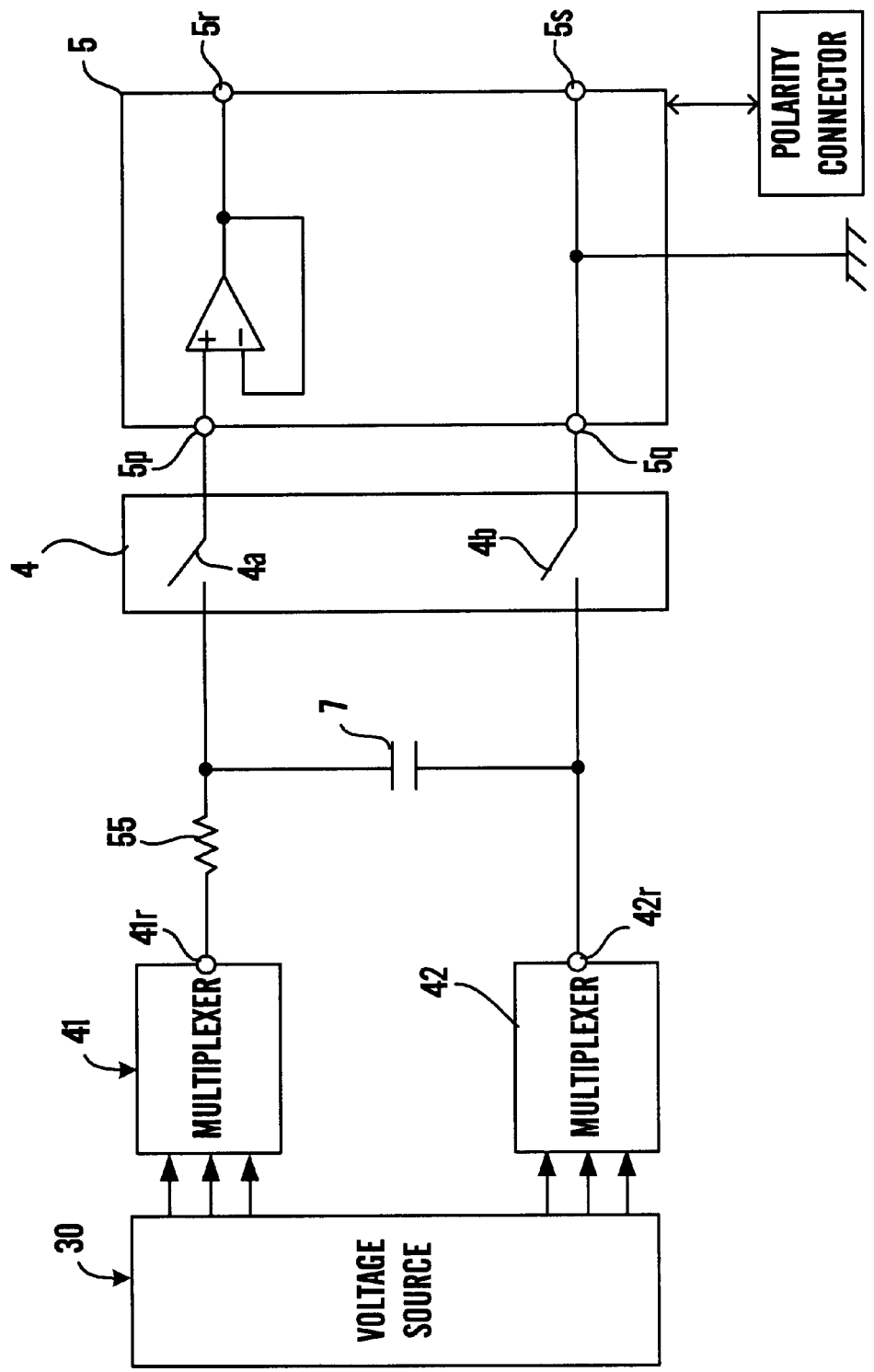
FIG. 21 is a circuit diagram showing a configuration of a voltage measuring apparatus in a 13th embodiment of the present invention.

FIG. 21 is a circuit diagram showing a configuration of a voltage measuring apparatus in a 13th embodiment of the present invention. In this embodiment, in the configuration of the voltage measuring apparatus, a resistor is connected between the first multiplexer and the capacitor. Other elements and portions are similar to those of the sixth embodiment, and therefore superposed descriptions on the similar points are omitted.

As shown in FIG. 21, the voltage measuring apparatus of the present embodiment comprises the resistor 55 is provided between the first multiplexer 41 and the capacitor 7. With this configuration, the voltage measuring apparatus of the present embodiment can make voltage measurements by reducing the effects of external high frequency noise. More specifically, most of the load of the voltage source 30 is an inverter apparatus that drives a motor or lighting equipment. This inverter system contains multiphase, steep pulse noise of several kilohertz or higher in a scattered manner, and this pulse noise appears through the load current in the voltage measured by the voltage measuring apparatus. When the voltage containing this pulse noise is tracked and held in the capacitor 7 by the first and second multiplexers 41 and 42, the accuracy of voltage measurement somewhat degrades.

By contrast, in the voltage measuring apparatus of the present embodiment, the resistor 55 gives the capacitor 7 a time constant that reduces the high frequency response. The resistor can be placed anywhere on the voltage source side of the capacitor 7, but the number of resistors used can be reduced when it is placed between the first multiplexer 41 and the capacitor 7. In the case that the circuit is to be made symmetrical, an additional resistor having the same resistance value should be provided between the second multiplexer 42 and the capacitor 7.

Embodiment 14

Figure 22:
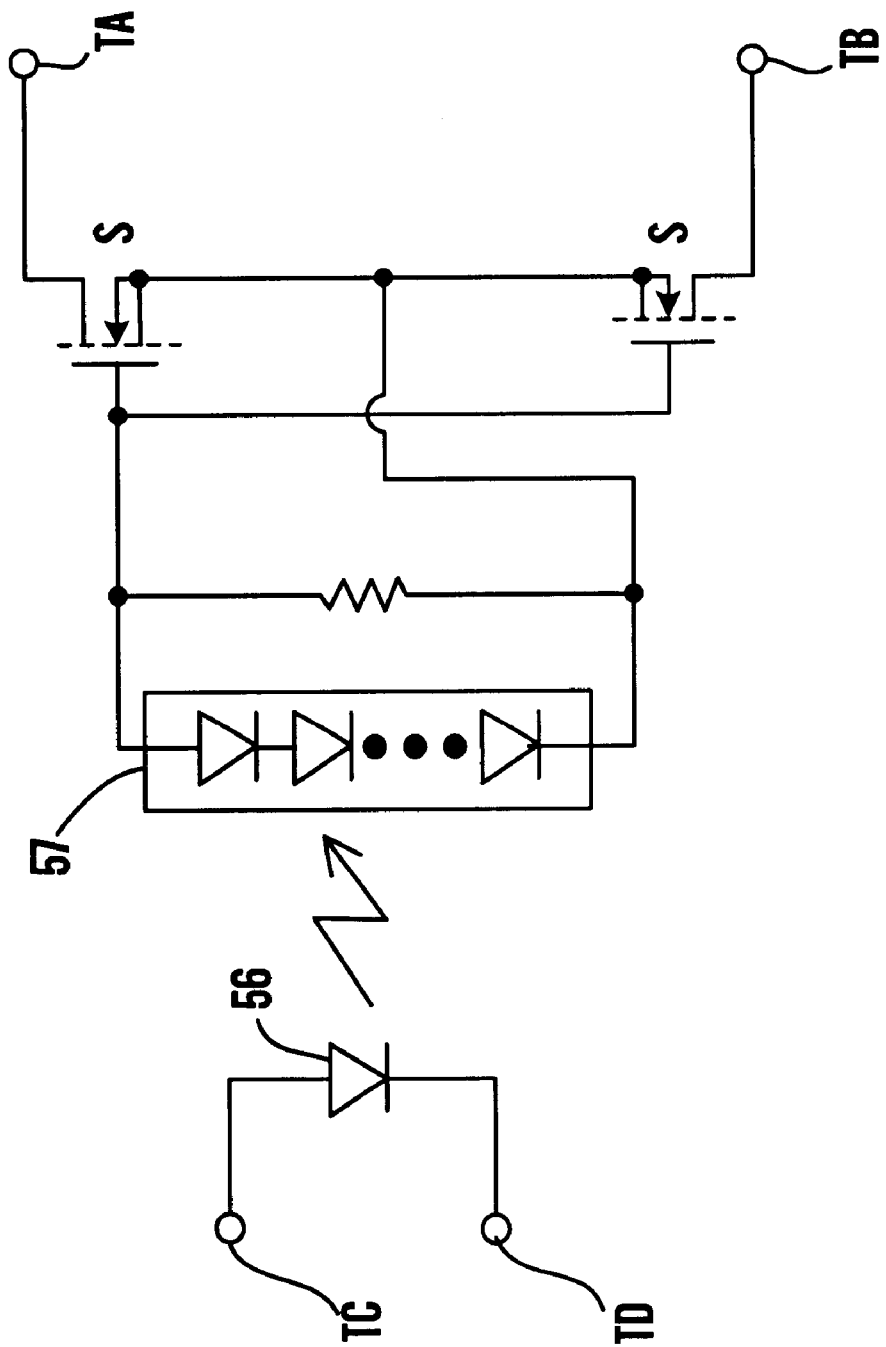
FIG. 22 is a circuit diagram showing a detailed configuration of a switch in a voltage measuring apparatus in a 14th embodiment of the present invention.
Figure 23:
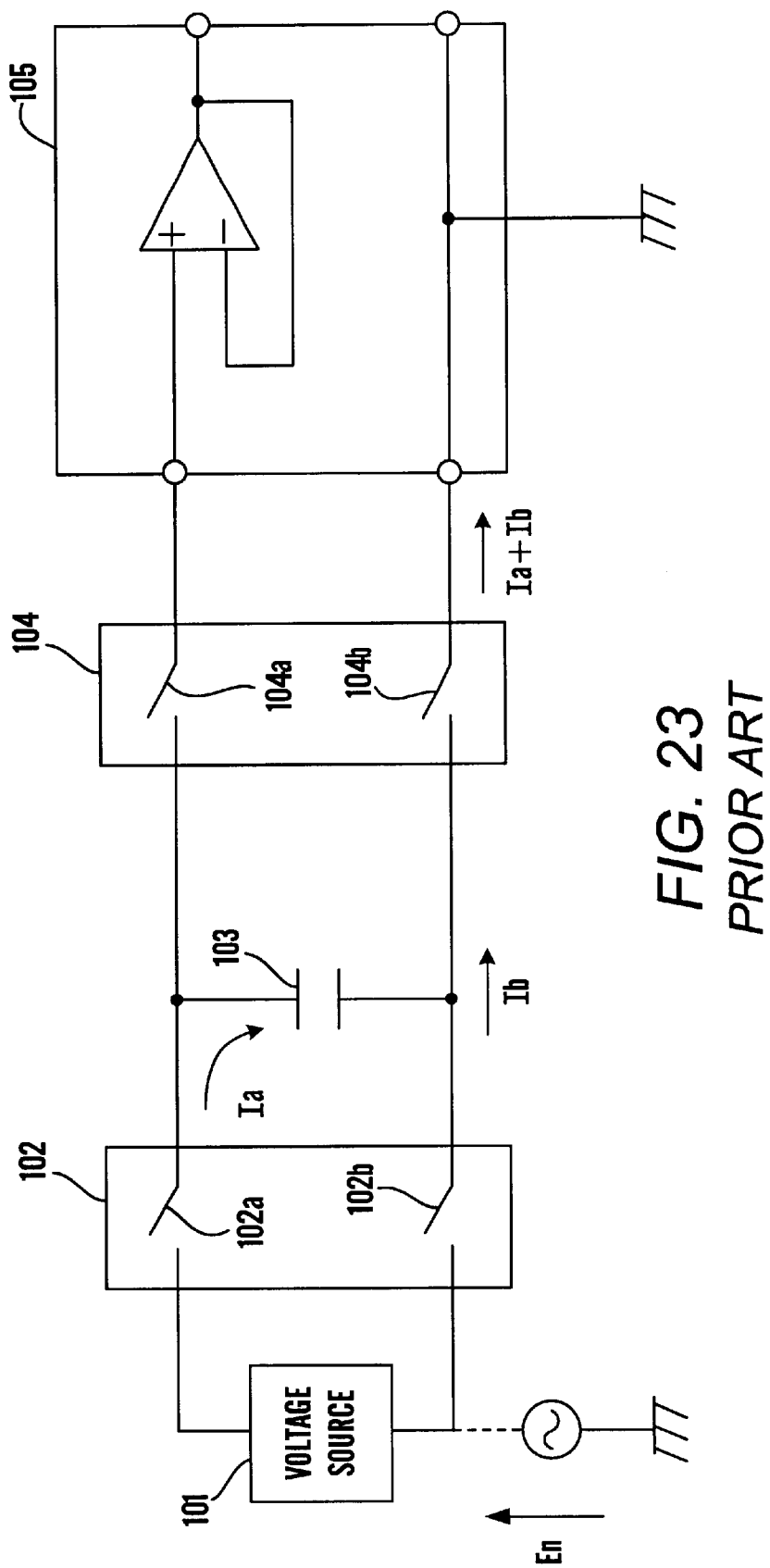
FIG. 23 is a circuit diagram showing a configuration of a major section in a second conventional voltage measuring apparatus.

FIG. 22 is a circuit diagram showing a detailed configuration of a switch in a voltage measuring apparatus in a 14th embodiment of the present invention. In this embodiment, in the configuration of the voltage measuring apparatus, each switch is constructed using a semiconductor relay device which drives the gate of a MOS transistor in an optically isolated manner. Other elements and portions are similar to those of the aforementioned embodiments, and therefore superposed descriptions on the similar points are omitted.

In FIG. 22, the switch is a semiconductor relay device which drives the gates of two MOS transistors in an optically isolated manner, namely, a bidirectional switch in which a photoelectric device 57 is operated by light from an LED 56 to connect between terminals TA and TB. This switch is used with the terminals TA and TB connected in the circuit, for example, in place of the switch 2a shown in FIG. 1.

The driving circuit (not shown) for causing the LED 56 to emit light is connected to terminals TC and TD. Specific examples of semiconductor relay devices such as described above include one disclosed in U.S. Pat. No. 4,564,770.

Such optically isolated driving switches provide excellent optical isolation from the driven side and excellent switch characteristics such as high voltage withstanding in the OFF-state and low resistance in the ON-state, and their shortcoming, i.e., common mode error due to high capacitance in the OFF-state, can be resolved using the configuration shown in each of the foregoing embodiments. Accordingly, when the switch shown in FIG. 22 is used for each switch shown in the first to 14th embodiments, a highly practical voltage measuring apparatus can be easily constructed.

Although the invention has been described in some detail dealing with the preferred embodiments, the configuration details of any of the preferred embodiments disclosed herein may be changed or modified, and any changes in the combination or order of elements thereof can be accomplished without departing from the spirit and scope of the invention as set forth in the appended claims.

POTENTIAL FOR EXPLOITATION IN INDUSTRY

The present invention is applicable for a voltage measuring apparatus that uses a flying capacitor method to secure electrical isolation from an electrical apparatus to be measured, and that measures the voltage from the electrical apparatus in an electrically isolated manner, and the voltage measuring apparatus of the invention is advantageous for use with a monitor apparatus in an electrical system for making voltage measurements.

What is claimed is:

1. A voltage measuring apparatus comprising:
   (N+1) voltage detection terminals connected to N series connected voltage sources wherein N is an integer;
   a capacitor;
   a first multiplexer for selectively connecting odd-numbered ones of the voltage detection terminals to one terminal of the capacitor;
   a second multiplexer for selectively connecting even-numbered ones of the voltage detection terminals to the other terminal of the capacitor; wherein the second multiplexer and the first multiplexer act as a first switching device;
   a buffer circuit;
   a second switching device for connecting both terminals of the capacitor to the buffer circuit; and,
   a polarity corrector for making voltages from odd-numbered ones of the voltage sources the same in polarity as voltages from even-numbered ones of the voltage sources.

2. A voltage measuring apparatus according to claim 1, wherein the polarity corrector comprises an absolute value circuit.

3. A voltage measuring apparatus according to claim 1, wherein the polarity corrector is configured by providing the second switching device with a polarity selection function.

4. A voltage measuring apparatus according to claim 1, wherein the polarity corrector is configured of polarity selection switch that is provided between the capacitor and the first and the second multiplexers and that is synchronized in time with the first and the second multiplexers.

5. A voltage measuring apparatus according to claim 1, wherein the switches in the apparatus comprise a semiconductor relay device which drives a gate of a MOS transistor in an optically isolated manner.

6. A voltage measuring apparatus according to claim 1, wherein a switch that is synchronized in time with the first and the second multiplexers is provided between the capacitor and the first and the second multiplexers.

7. A voltage measuring apparatus according to claim 1, wherein the capacitor comprises a plurality of capacitor elements divided at a connection point between two sections of the same capacitance, and
   the voltage measuring apparatus further includes a differential amplifier connected to the second switching device, and
   a third switch for connecting the connection point in the capacitor to a signal reference potential of the differential amplifier in time synchronization with the second switching device.

8. A voltage measuring apparatus according to claim 7, wherein a pair of switched that are synchronized in time with the first and second multiplexers are provided between the capacitor and the first and second multiplexers.

9. A voltage measuring apparatus according to claim 1, further comprising a voltage divider for resistive-dividing the voltage appearing at both ends of the series connection of the N voltage sources, and a multiplexer for taking therein an output voltage of the voltage divider.

10. A voltage measuring apparatus according to claim 9, wherein a switch is provided between the voltage sources and the voltage divider.

11. A voltage measuring apparatus according to claim 1, wherein a resistor is provided between the capacitor and the multiplexers.

* * * * *